(12) United States Patent
Ding et al.

(10) Patent No.: US 9,791,733 B2
(45) Date of Patent: *Oct. 17, 2017

(54) ARRAY SUBSTRATE, MANUFACTURE METHOD THEREOF, AND DISPLAY DEVICE

(71) Applicants: Shanghai Tianma Micro-electronics Co., Ltd., Shanghai (CN); Tianma Micro-electronics Co., Ltd., Shenzhen (CN)

(72) Inventors: Hong Ding, Shanghai (CN); Qijun Yao, Shanghai (CN); Lingxiao Du, Shanghai (CN); Jun Ma, Xiamen (CN); Xiaoye Li, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/204,318

(22) Filed: Jul. 7, 2016

(65) Prior Publication Data
US 2016/0320650 A1 Nov. 3, 2016

Related U.S. Application Data

(63) Continuation-in-part of application No. 14/728,995, filed on Jun. 2, 2015, now Pat. No. 9,397,123.

(30) Foreign Application Priority Data

Dec. 29, 2014 (CN) .......................... 2014 1 0856763

(51) Int. Cl.
*G02F 1/1333* (2006.01)
*H01L 27/12* (2006.01)
(Continued)

(52) U.S. Cl.
CPC ........ *G02F 1/13338* (2013.01); *G02F 1/1368* (2013.01); *G02F 1/13394* (2013.01);
(Continued)

(58) Field of Classification Search
CPC ............. G02F 1/13338; G02F 2201/40; G02F 1/136286; G02F 1/1333; G02F 1/1343;
(Continued)

(56) References Cited

U.S. PATENT DOCUMENTS 9,397,123 B1* 7/2016 Ding ................... H01L 27/1244
2010/0315362 A1* 12/2010 Cheng ................... G06F 3/0412
345/173

(Continued)

*Primary Examiner* — Evan Pert
*Assistant Examiner* — Changhyun Yi
(74) *Attorney, Agent, or Firm* — Anova Law Group, PLLC

(57) ABSTRACT

An array substrate, a display device and a method for fabrication the array substrate are provided. The array substrate comprises a base substrate; gate lines and data lines; pixel electrodes; a common electrode layer including at least one first slot and at least one second slot at least partially overlapped with the first slot; at least one shielding electrode disposed above the data line; and at least one shielding branch electrode disposed above the gate line and electrically connected to the shielding electrode. A projection of the shielding electrode onto the data line is at least partially overlapped with the data line, a projection of the shielding branch electrode onto the gate line is at least partially overlapped with the gate line, and the array substrate exhibits at least one raised area where the at least one shielding branch electrode is embedded.

20 Claims, 19 Drawing Sheets

(51) Int. Cl.
*G02F 1/1368* (2006.01)
*G02F 1/1362* (2006.01)
*G02F 1/1343* (2006.01)
*G02F 1/1339* (2006.01)

(52) U.S. Cl.
CPC .. *G02F 1/133345* (2013.01); *G02F 1/134309* (2013.01); *G02F 1/136227* (2013.01); *G02F 1/136286* (2013.01); *H01L 27/124* (2013.01); *H01L 27/1244* (2013.01); *H01L 27/1259* (2013.01); *G02F 2001/13629* (2013.01); *G02F 2001/134318* (2013.01); *G02F 2001/136218* (2013.01); *G02F 2001/136295* (2013.01); *G02F 2201/121* (2013.01); *G02F 2201/123* (2013.01)

(58) Field of Classification Search
CPC ...... G06F 3/0416; G06F 3/044; G06F 3/0412; H01L 27/3248; H01L 27/323
USPC .............................. 257/40; 345/174; 349/12
See application file for complete search history.

(56) References Cited

U.S. PATENT DOCUMENTS

| | | | |
|---|---|---|---|
| 2011/0102698 A1* | 5/2011 | Wang | G02F 1/13338 349/54 |
| 2014/0125626 A1 | 5/2014 | Yang et al. | |
| 2014/0333571 A1 | 11/2014 | Hu | |
| 2015/0153882 A1* | 6/2015 | Kim | G06F 3/041 345/174 |

* cited by examiner

ARRAY SUBSTRATE, MANUFACTURE METHOD THEREOF, AND DISPLAY DEVICE

CROSS-REFERENCES TO RELATED APPLICATIONS

This application is a continuation-in-part (CIP) application of U.S. patent application Ser. No. 14/728,995, filed on Jun. 2, 2015, which claims the priority to Chinese Patent Application No. 201410856763.6, entitled "ARRAY SUBSTRATE, MANUFACTURE METHOD THEREOF, AND DISPLAY DEVICE", filed on Dec. 29, 2014 with the State Intellectual Property Office of People's Republic of China, the content of all of which is incorporated herein by reference in its entirety.

BACKGROUND OF THE INVENTION

As compared to a touch display device with a touch panel provided on a liquid crystal display (LCD) panel, a touch display device with integrated touch display device and LCD panel becomes a mainstream touch display device today, because of getting rid of substrates and thinner device thickness. Touch display devices with integrated touch display device and LCD panel often have an on-cell structure or an in-cell structure. The in-cell structure refers to embed a touch panel functionality into liquid-crystal pixels, and the on-cell structure refers to embed a touch panel functionality between a color filter or color film substrate and a polarizer substrate.

In a touch display device with the in-cell structure, to achieve the touch panel functionality, a common electrode layer of the LCD panel has to be divided into a plurality of common electrode blocks through etching and slotting, and a plurality of slot are often formed in the common electrode layer. In the current touch display device, the slot may be formed between two adjacent pixel units in a same row of pixel units. Because the data line is often disposed between two adjacent pixel units in the same row, the slot facing the data line may result a leakage of the electric field of the data line and a corresponding light leakage of the display panel.

The electric field of the data line may be shielded by disposing metal wirings between the slot and the data line. However, the width of the metal wirings and the alignment between the metal wiring and the data line may be substantially difficult to be controlled. When the width of the metal wiring is substantially narrow and/or the metal wiring and the data line are misaligned, the light leakage may still occur and the image performance may be degraded. Moreover, an accurate alignment between the metal wiring and the data line may bring extra difficulties to the fabrication process.

The disclosed array substrate and display device are directed to solve one or more problems set forth above and other problems.

BRIEF SUMMARY OF THE DISCLOSURE

One aspect of the present disclosure provides an array substrate. The array substrate comprises a base substrate; a plurality of gate lines and a plurality of data lines disposed on the base substrate, wherein the gate lines and the data lines are insulated from each other and cross each other to define a plurality of pixel units; a plurality of pixel electrodes; a common electrode layer including at least one first slot and at least one second slot, wherein the second slot is at least partially overlapped with the first slot, and the common electrode layer has a plurality of common electrodes; at least one shielding electrode disposed above the data line; and at least one shielding branch electrode disposed above the gate line and electrically connected to the shielding electrode. The first slot and the shielding electrode are extending in an extension direction of the data lines, the second slot and the shielding branch electrode are extending in an extension direction of the gate lines, a projection of the shielding electrode onto the data line is at least partially overlapped with the data line, a projection of the shielding branch electrode onto the gate line is at least partially overlapped with the gate line, and the array substrate exhibits at least one raised area where the at least one shielding branch electrode is embedded Another aspect of the present disclosure provides a display device. The display device comprises the above array substrate, an opposite substrate including a plurality of photo spacers; and display medium sandwiched between the array substrate and the opposite substrate. At least one photo spacer is attached to the at least one raised area where the at least one shielding branch electrode is embedded.

Another aspect of the present disclosure provides an array substrate fabrication method. The fabrication method comprises providing a base substrate; forming a plurality of gate lines on the base substrate; forming a plurality of data lines on the base substrate, wherein the gate lines and the data lines are insulated from each other and cross each other to define a plurality of pixel units; forming a fifth insulating layer on the data lines; forming a plurality of pixel electrodes above the data lines; forming at least one shielding electrode and at least one shielding branch electrode above the data lines, wherein the shielding electrode and the shielding branch electrode are electrically connected; forming a common electrode layer including at least one first slot and at least one second slot above the data lines, wherein the first slot is at least partially overlapped with the second slot and the common electrode layer includes a plurality of common electrodes. The first slot and the shielding electrode are extending in an extension direction of the data lines, the second slot and the shielding branch electrode are extending in an extension direction of the gate lines, a projection of the shielding electrode onto the data line is at least partially overlapped with the data line, a projection of the shielding branch electrode onto the gate line is at least partially overlapped with the gate line, and the array substrate exhibits at least one raised area where the at least one shielding branch electrode is embedded.

Other aspects of the present disclosure can be understood by those skilled in the art in light of the description, the claims, and the drawings of the present disclosure.

BRIEF DESCRIPTION OF THE DRAWINGS

In order to illustrate the technical solutions according to the embodiments of the disclosure or in the prior art more clearly, the drawings to be used in the description of the embodiments or the prior art are described briefly hereinafter. Apparently, the drawings described hereinafter are only some embodiments of the present disclosure, and other drawings may be obtained by those skilled in the art according to those drawings without creative effort.

DETAILED DESCRIPTION OF THE PREFERRED EMBODIMENTS

Hereinafter, the technical solutions according to the embodiments of the disclosure are described clearly and completely in conjunction with the drawings of the disclosure. Apparently, the described embodiments are only a few of the embodiments of the disclosure. Any other embodiments obtained by those skilled in the art based on the embodiments of the disclosure without creative effort fall within the scope of protection of the disclosure.

An array substrate is provided according to an embodiment of the disclosure. The array substrate includes a substrate, and a plurality of gate lines and data lines are provided on the substrate. The gate lines and the data lines are insulated from each other and cross each other to define a plurality of pixel units, and the pixel units include pixel electrodes and common electrodes. A first slot is provided on the common electrode in an extension direction of the data line, and the first slot at least partially overlaps the pixel electrode.

An aperture region is provided over the gate line, and the aperture region at least partially overlaps the first slot. A shielding electrode and a shielding branch electrode are provided over the data line in the extension direction of the data line, wherein the shielding branch electrode is electrically connected to the shielding electrode; A projection of the shielding electrode onto the data line at least partially overlaps the data line; the shielding branch electrode is provided in the aperture region, and a projection of the shielding branch electrode onto the gate line at least partially overlaps the gate line.

To make the technical solutions according to the embodiments of the disclosure clearer, a detailed description of the above solution is provided in conjunction with the drawings.

Figure 1:
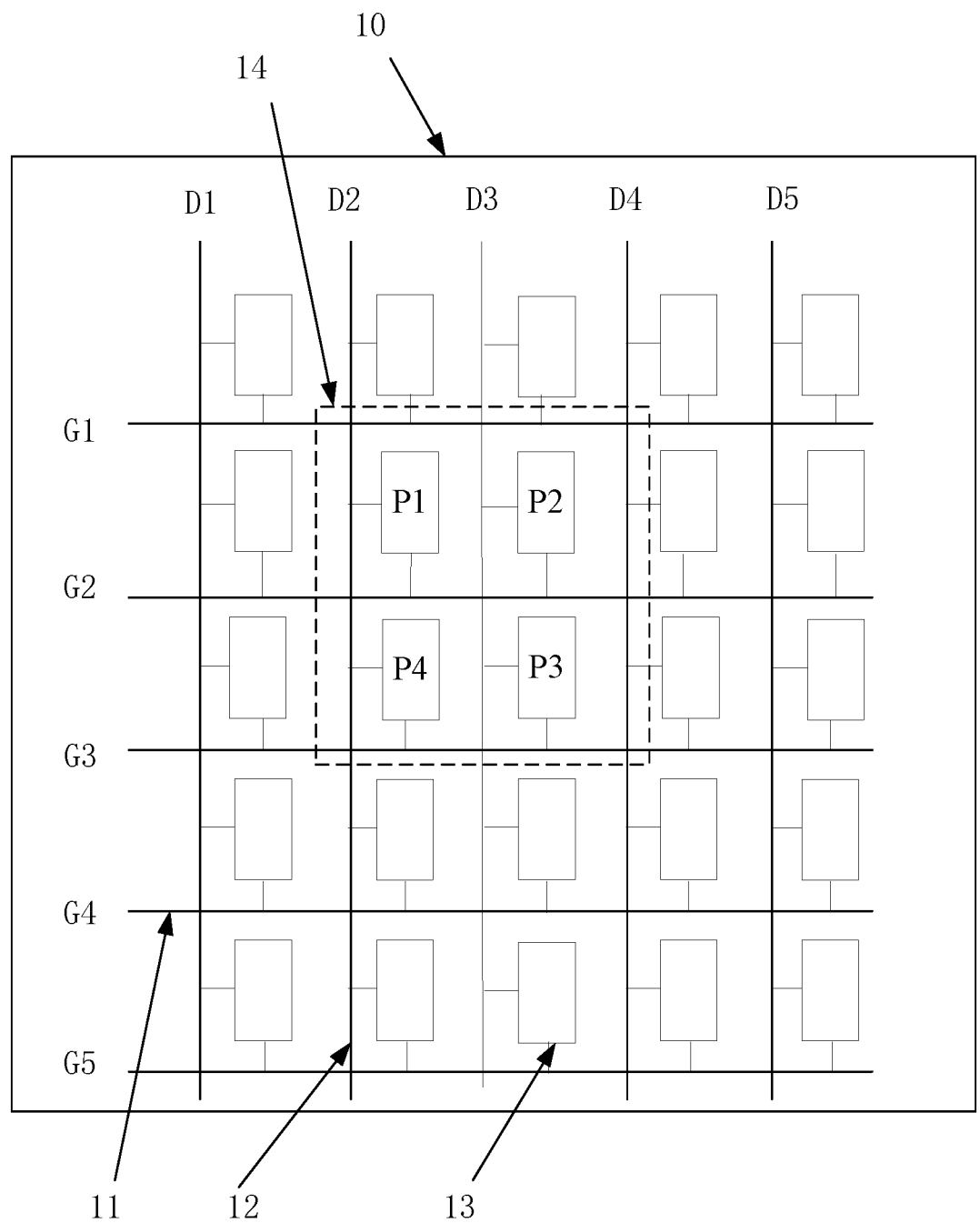
FIG. 1 is a structure diagram of an array substrate according to an embodiment of the disclosure.
Figure 2:
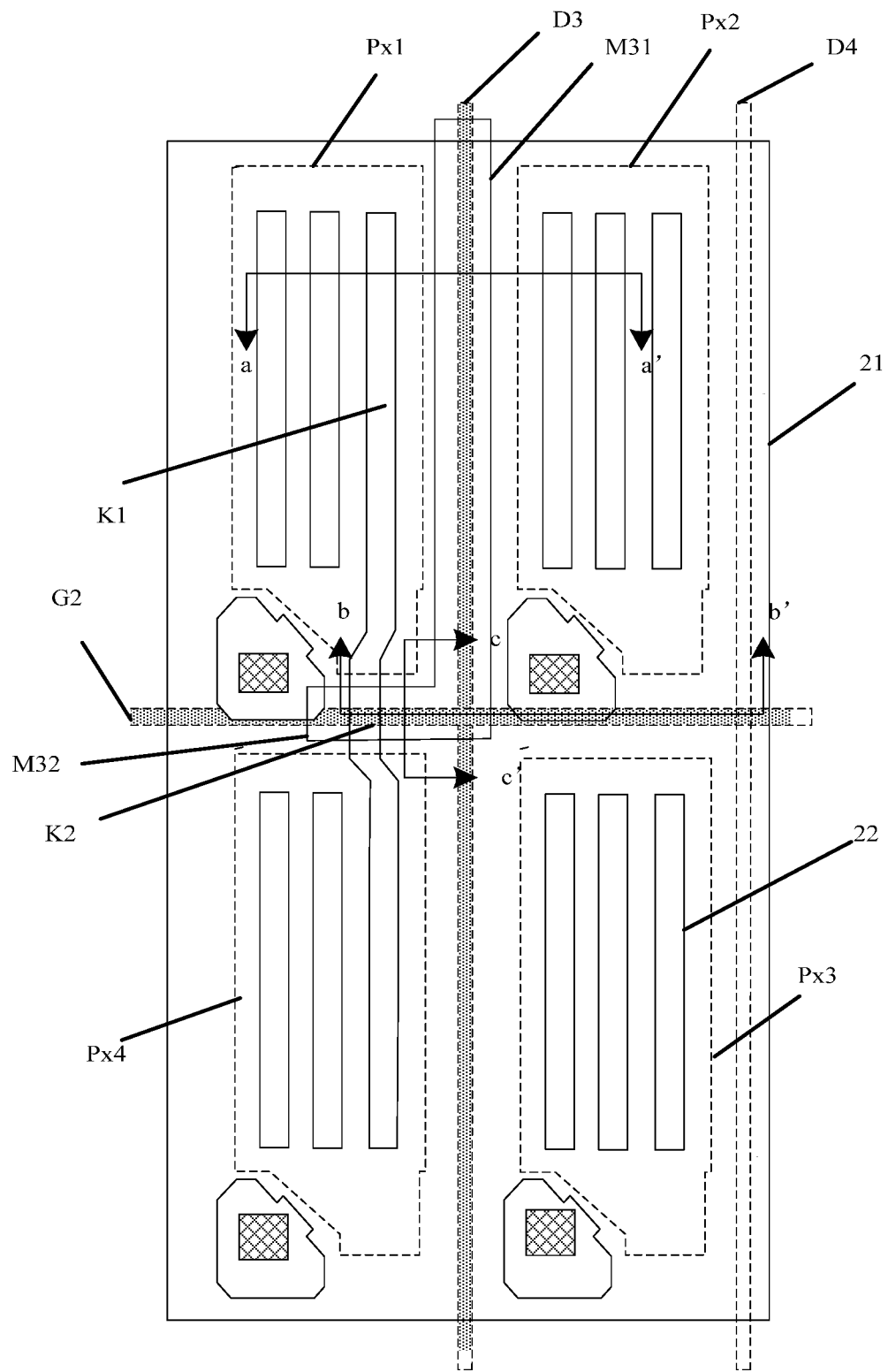
FIG. 2 is an enlarged partial view of a pixel unit structure of the array substrate shown in FIG. 1.

Referring to FIG. 1 and FIG. 2, FIG. 1 is a structure diagram of an array substrate according to an embodiment of the disclosure, and FIG. 2 is an enlarged partial view of a pixel unit structure of the array substrate shown in FIG. 1.

The array substrate includes a substrate 10, and a plurality of gate lines 11 and data lines 12 are provided on the substrate 10. The gate lines 11 and the data lines 12 are insulated from each other and cross each other to define a plurality of pixel units 13. Pixel units 13 include pixel electrodes and common electrodes.

The pixel electrodes of the respective pixel units 13 are fabricated via a same patterned pixel electrode layer (may be ITO layer), and the common electrodes of the respective pixel units 13 are fabricated via a same patterned common electrode layer 21 (may be ITO layer).

The plurality of pixel units 13 include at least one first pixel unit group 14, which is a 2×2 pixel unit matrix. The first pixel unit group 14 includes a first pixel unit P1, a second pixel unit P2, a third pixel unit P3, and a fourth pixel unit P4 which are arranged clockwise. A data line D3 is provided between the first pixel unit P1 and the second pixel unit P2 and between the fourth pixel unit P4 and the third pixel unit P3; a gate line G2 is provided between the first pixel unit P1 and the fourth pixel unit P4 and between the second pixel unit P2 and the third pixel unit P3. The first pixel unit P1 includes a pixel electrode Px1, the second pixel unit P2 includes a pixel electrode Px2, the third pixel unit P3 includes a pixel electrode Px3, and the fourth pixel unit P4 includes a pixel electrode Px4.

An array structure with 5×5 pixel units is shown in FIG. 1, which has five gate lines 11 including gate lines G1-G5 and five data lines 12 including data lines D1-D5. The number of rows and columns of pixels may be any positive integer, and is not limited to that in the embodiment shown in FIG. 1.

A first slot K1 is provided on the common electrode layer 21 in the extension direction of the data line 12, and the first slot K1 at least partially overlaps the pixel electrode. The first slot may be provided on the common electrode for each pixel unit, or the first slot may be provided on the common electrode for one or more predetermined pixel units.

An aperture region K2 is provided over the gate line 11, and the aperture region K2 at least partially overlaps the first slot K1. A shielding electrode M31 and a shielding branch electrode M32 are provided over the data line 12 in the extension direction of the data line 12, wherein the shielding branch electrode M32 is electrically connected to the shielding electrode M31.

The projection of the shielding electrode M31 onto the data line D3 at least partially overlaps the data line D3; the shielding branch electrode M32 is provided in the aperture region K2, and the projection of the shielding branch electrode M32 onto the gate line G2 at least partially overlaps the gate line G2.

A first insulating layer is provided over the data line 12; the shielding electrode M31 and the shielding branch electrode M32 are provided on the first insulating layer, and the shielding electrode M31 and the shielding branch electrode M32 are electrically connected. A second insulating layer with a first via hole is provided between the shielding electrode M31 and the common electrode layer 21 and between the shielding branch electrode M32 and the common electrode layer 21. The common electrode layer 21 is provided on the second insulating layer. The common electrode is electrically connected to the shielding electrode M31 or the shielding branch electrode M32 through the first via hole.

On array substrate shown in FIG. 2, the pixel electrode is provided between the shielding electrode M31 and the data line 12, and the common electrode is provided over the pixel electrode. It is required to etch the common electrode and form an electrode structure including a plurality of strip electrodes 22 to generate a controllable electric field between the pixel electrode and the common electrode to drive a liquid crystal layer.

The gate electrodes of the thin-film transistors of respective pixel units are provided on the substrate, and a gate insulating layer is provided on the gate electrodes. An active layer is provided on the gate insulating layer, and source electrodes and drain electrodes of the thin-film transistors of respective pixel units as well as a metal layer, on which the data lines 12 are located, are provided on the active layer. A first insulating layer is provided on the source electrodes and drain electrodes of the thin-film transistors as well as the metal layer on which the data lines 12 are located.

Figure 3:
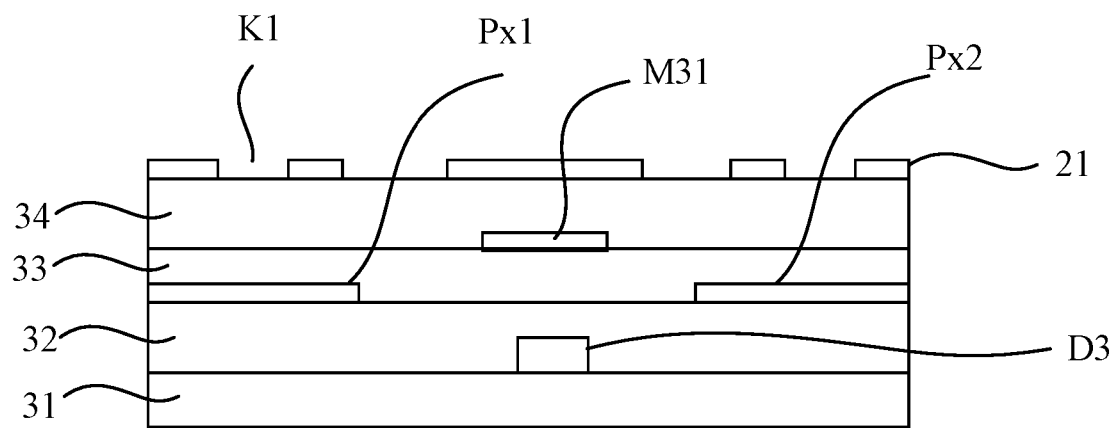
FIG. 3 is a sectional view of the array substrate shown in FIG. 2 along the direction of aa'.
Figure 4:
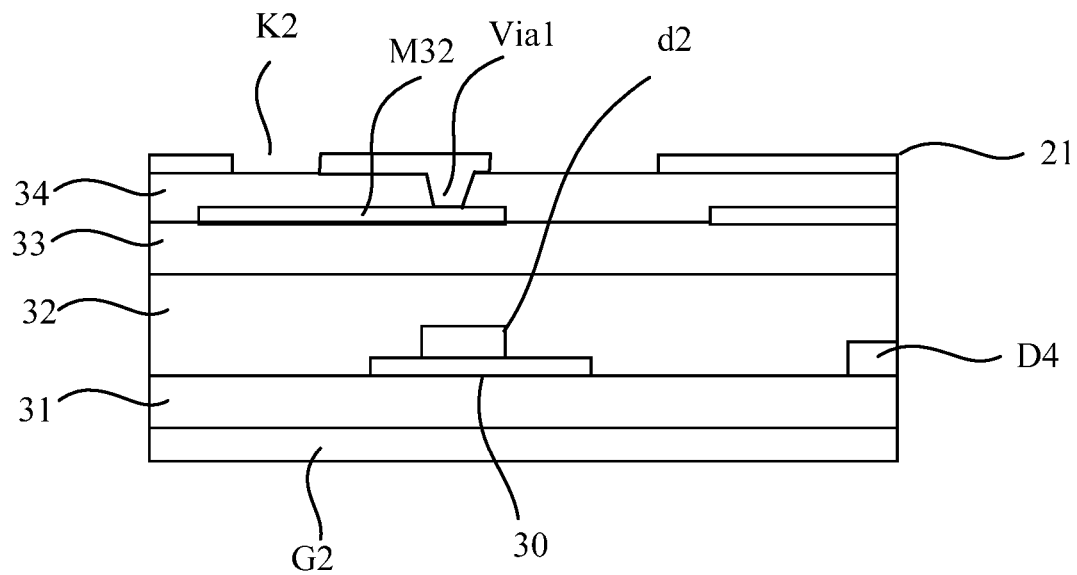
FIG. 4 is a sectional view of the array substrate shown in FIG. 2 along the direction of bb'.
Figure 5:
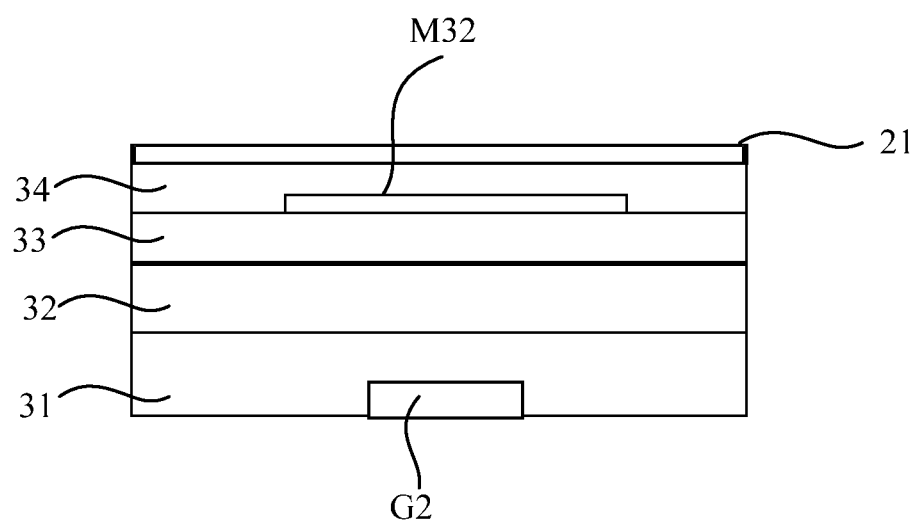
FIG. 5 is a sectional view of the array substrate shown in FIG. 2 along the direction of cc'.

Specifically, referring to FIG. 3 to FIG. 5, FIG. 3 is a sectional view of the array substrate shown in FIG. 2 along the direction of aa', FIG. 4 is a sectional view of the array substrate shown in FIG. 2 along the direction of bb', and FIG. 5 is a sectional view of the array substrate shown in FIG. 2 along the direction of cc'.

In the first pixel unit group 14: the gate line G2 is provided on the substrate surface; the gate line G2 is covered with the gate insulating layer 31; the active layer 30, the drain electrode d2 of the thin-film transistor of the second pixel unit P2 and the metal layer on which the data lines D3 and D4 locates are provided on the surface of the gate insulating layer 31; the first insulating layer 32 covers the surface of the drain electrode d2 and the data lines D3 and D4; the pixel electrode Px1 of the first pixel unit P1 is provided on the surface of the first insulating layer 32 at a location corresponding to the first pixel unit P1, and the pixel electrode Px2 of the second pixel unit P2 is provided on the surface of the first insulating layer 32 at the location corresponding to the second pixel unit P2; the fourth insulating layer 33 covers the surface of the pixel electrode Px1 and the pixel electrode Px2.

The shielding electrode M31 and the shielding branch electrode M32 are provided on the surface of the fourth insulating layer 33; the second insulating layer 34 covers the surface of the shielding electrode M31 and the shielding branch electrode M32, a common electrode layer 21 is provided on the surface of the second insulating layer 34, a first slot K1 is provided in the common electrode corresponding to the pixel electrode Px1, and an aperture region K2 is provided in the common electrode layer 21 over the gate line between the pixel electrodes Px1 and Px4. The common electrode includes a plurality of strip electrodes 22 in the region corresponding to the pixel units. The common electrode is electrically connected to the shielding branch electrode M32 through the first via hole Via1.

According to the implementations shown in FIG. 3 to FIG. 5, a first insulating layer 32 is provided between the pixel electrode and the drain electrode d2 of the thin-film transistor and between the pixel electrode and the metal layer on which the data line D3 locates, and the electrical connection between the pixel electrode and the drain electrode of the thin-film transistor needs to be realized through a via hole. In other embodiments, the first insulating layer 32 may be omitted, the electric connection may be achieved by overlapping part of the pixel electrode to the drain electrode of the thin-film transistor, and other parts of the pixel electrode are in the same layer as the drain electrode of the thin-film transistor.

The above is just one implementation of the disclosure; the pixel electrode may alternatively be provided over a common electrode layer according to another implementation of the disclosure, i.e., the common electrode layer is provided between the substrate of the array substrate and the pixel electrodes of respective pixel units. It is required to etch the pixel electrode and form an electrode structure including a plurality of strip electrodes to generate a controllable electric field between the pixel electrode and the common electrode to drive a liquid crystal layer. Each common electrode may be fabricated into one or more strips.

In this case, the gate electrodes of the thin-film transistors of respective pixel units are provided on the substrate, a gate insulating layer is provided on the gate electrodes, an active layer is provided on the gate insulating layer, and source electrodes and drain electrodes of the thin-film transistors of respective pixel units as well as the metal layer on which the data lines locate are provided on the active layer, a first insulating layer is provided on the source electrodes and drain electrodes as well as the metal layer on which the data lines locate; a third insulating layer is provided on the common electrode layer, and a pixel electrode is provided on the third insulating layer, wherein a second via hole is provided to pass through the first, second and third insulating layers, and the pixel electrode is electrically connected to the drain electrode of the thin-film transistor through the second via hole.

Figure 6:
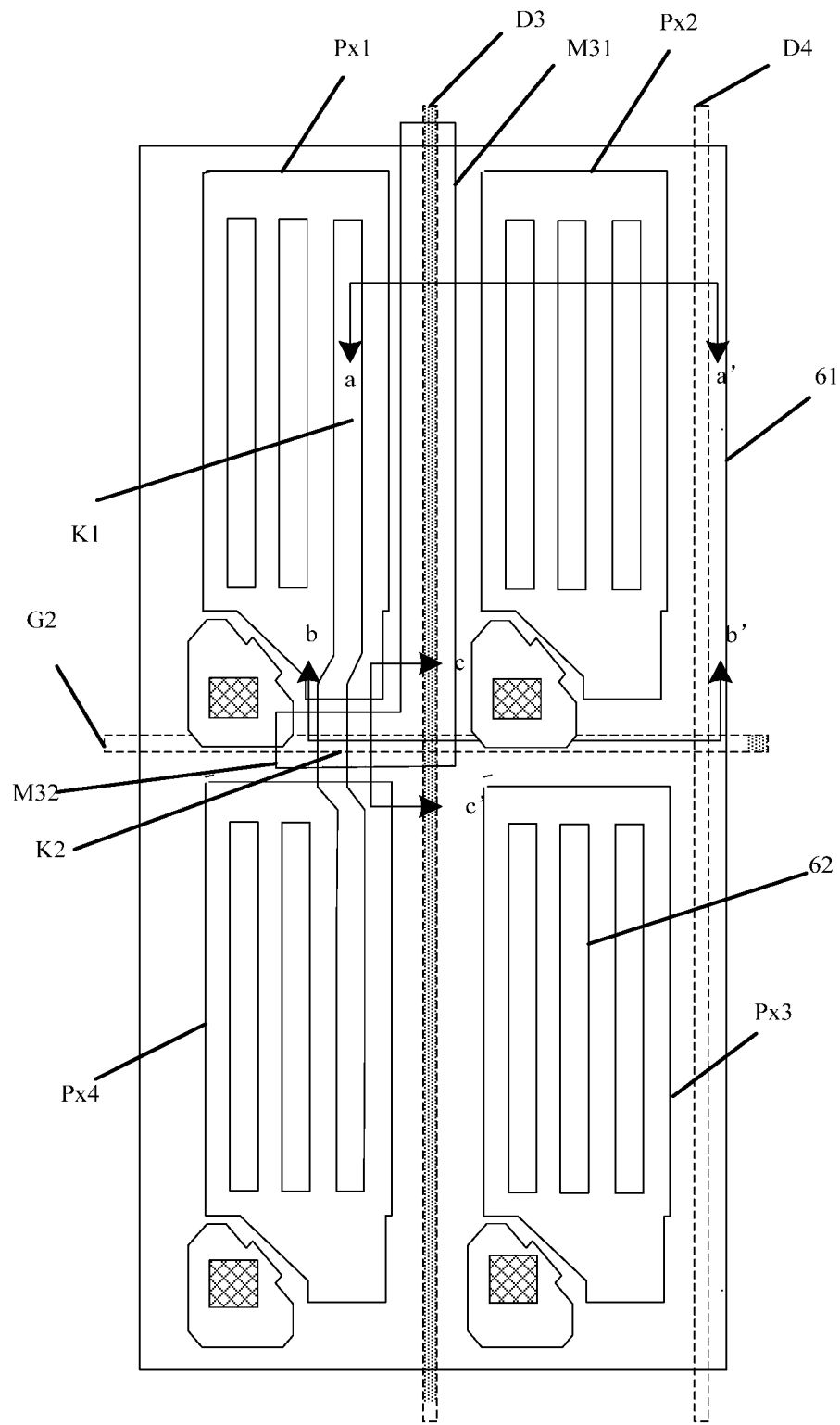
FIG. 6 is an enlarged partial view of another pixel unit structure of the array substrate shown in FIG. 1.

Specifically, reference is made to FIG. 6, which is an enlarged partial view of another pixel unit structure of the array substrate shown in FIG. 1, and the common electrode layer 61 is provided between the pixel electrodes and the substrate. In this case, since the pixel electrodes are provided on top, it is required to etch the respective pixel electrodes on top and form an electrode structure including a plurality of strip electrodes 62 in each pixel electrode to generate a controllable electric field between the pixel electrode and the common electrode layer 61 to drive a liquid crystal layer.

The common electrode layer 61 may be fabricated into one or more strips in the region corresponding to each pixel electrode.

Figure 7:
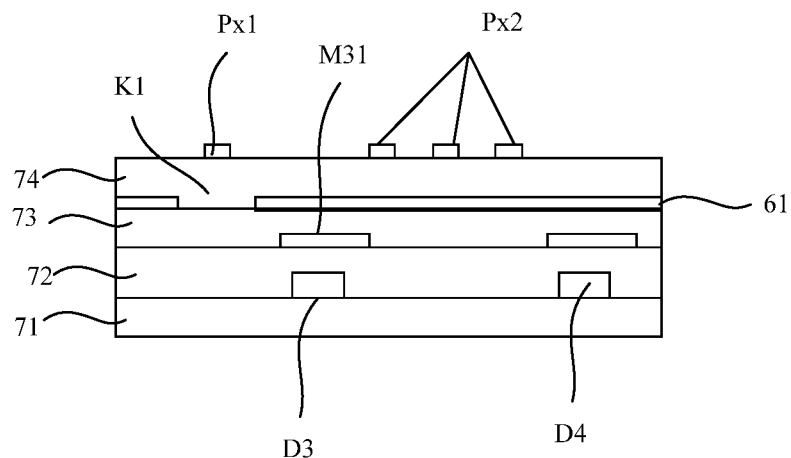
FIG. 7 is a sectional view of the array substrate shown in FIG. 6 along the direction of aa'.
Figure 8:
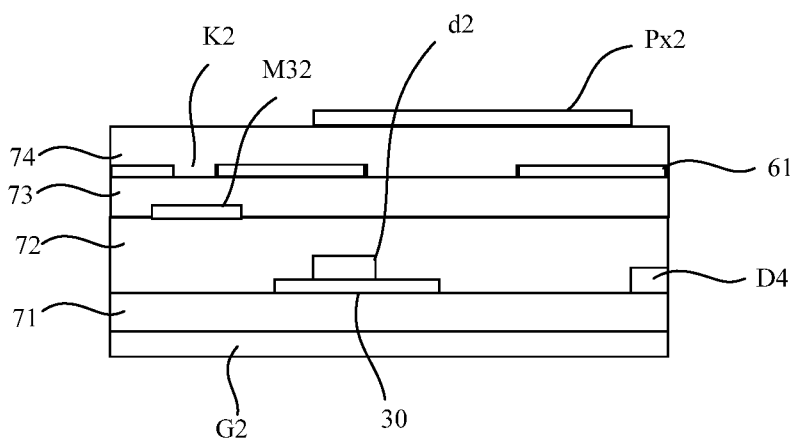
FIG. 8 is a sectional view of the array substrate shown in FIG. 6 along the direction of bb'.
Figure 9:
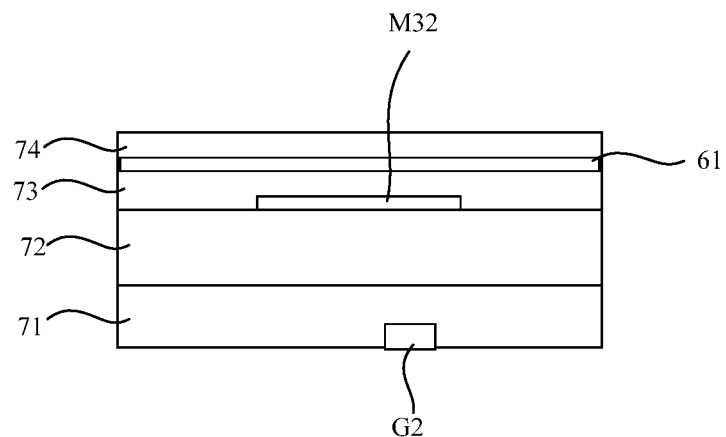
FIG. 9 is a sectional view of the array substrate shown in FIG. 6 along the direction of cc'.

Reference is made to FIG. 7 to FIG. 9, wherein FIG. 7 is a sectional view of the array substrate shown in FIG. 6 along the direction of aa', FIG. 8 is a sectional view of the array substrate shown in FIG. 6 along the direction of bb', and FIG. 9 is a sectional view of the array substrate shown in FIG. 6 along the direction of cc'.

In the first pixel unit group 14: the gate line G2 is provided on the substrate surface; the gate line G2 is covered with the gate insulating layer 71; the active layer 30, the drain electrode d2 of the thin-film transistor of the second pixel unit P2 and the metal layer on which the data lines D3 and D4 locates are provided on the surface of the gate insulating layer 71; the first insulating layer 72 covers the surface of the drain electrode d2 and the data lines D3 and D4; the shielding electrode M31 and the shielding branch electrode M32 are provided on the first insulating layer 72; the second insulating layer 73 is provided on the surface of the shielding electrode M31 and the shielding branch electrode M32; the patterned common electrode layer 61 is provided on the surface of the second insulating layer 73, a first slot K1 is provided on the common electrode layer 61 in the region corresponding to the first pixel unit P1, and an aperture region K2 is provided in the common electrode layer at a place over the gate line between the pixel electrodes Px1 and Px4; the third insulating layer 74 is provided on the surface of the common electrode layer 61; the pixel electrodes Px1 and Px2 are provided on the surface of the third insulating layer 74.

To make a pixel electrode electrically connect to a corresponding drain electrode, it is required to provide a second via hole passing through the first insulating layer 72, the second insulating layer 73, and the third insulating layer 74 so as to make the pixel electrode electrically connect to the corresponding drain electrode through the second via hole. To make the common electrode electrically connect to the shielding electrode M31 or the shielding branch electrode M32, it is required to provide a first via hole passing through the second insulating layer 73 so as to make the common electrode electrically connect to the shielding electrode M31 or the shielding branch electrode M32 through the first via hole.

A second slot is provided in the common electrode in the extending direction of the gate line. The common electrode is partitioned in the direction of the gate line by the second slot to achieve the time divisional driving of the touch and display. According to the embodiment, the aperture of the common electrode may run through several continuous pixel units in the column direction of the pixels as shown in FIG. 2 or FIG. 6.

It can be learn from the above description that, the aperture portion of the common electrode layer in the array substrate according to the embodiments of the disclosure is provided to include: the first slot at least partially overlapping the pixel electrode and an aperture region over the gate line. The first slot in the aperture portion of the common electrode is provided in the region facing the pixel unit without changing the location of the data line, rather than being provided between the pixel units in the conventional art, thus the configuration that the aperture portion facing the data line is avoided, the leakage of the electric field of the data line is avoided, and the problem of light leakage of the display panel is avoided. Meanwhile the aperture region in the aperture portion of the common electrode is provided between two adjacent pixel units in one pixel column and is provided over the gate line, thus only part of the gate line is exposed.

In addition, the leakage of the electric field of the data line is avoided using the shielding branch electrode to avoid the problem of light leakage. So the problem of light leakage caused by the aperture of the common electrode may be avoided effectively by changing the location of the aperture portion of the common electrode and by providing the shielding branch electrode for the array substrate. Furthermore, the aperture portion of the array substrate may be fabricated with a greater width in the direction of the pixel row, thus the process difficulty of forming the aperture portion decreases, and the short-circuit of the common electrodes on both sides of the first slot is avoided.

Figure 10:
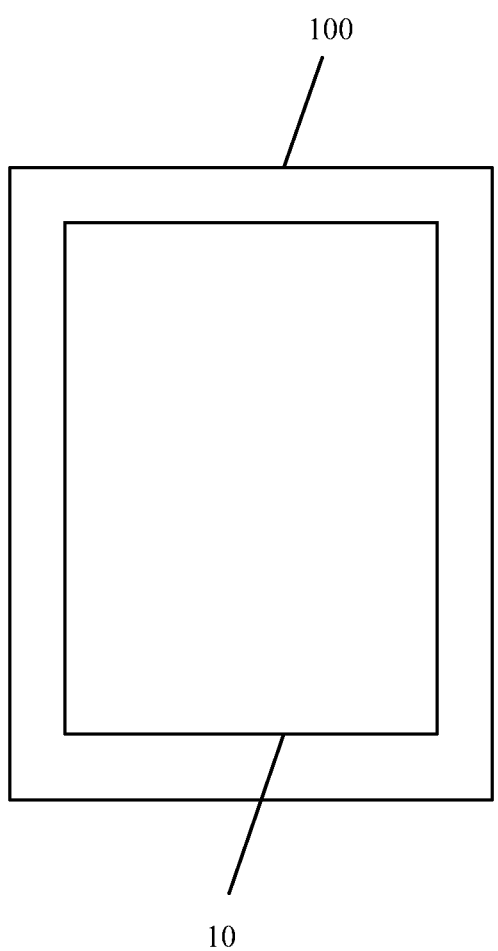
FIG. 10 is a structure diagram of a display panel according to an embodiment of the disclosure.

A display panel is further provided according to the embodiments of the disclosure, wherein the display panel includes the array substrate as described above. Reference is made to FIG. 10, which is a structure diagram of the display panel 100 according to an embodiment of the disclosure. The display panel 100 includes the array substrate 10 in any one of the above implementations according to the embodiments of the disclosure.

Figure 11:
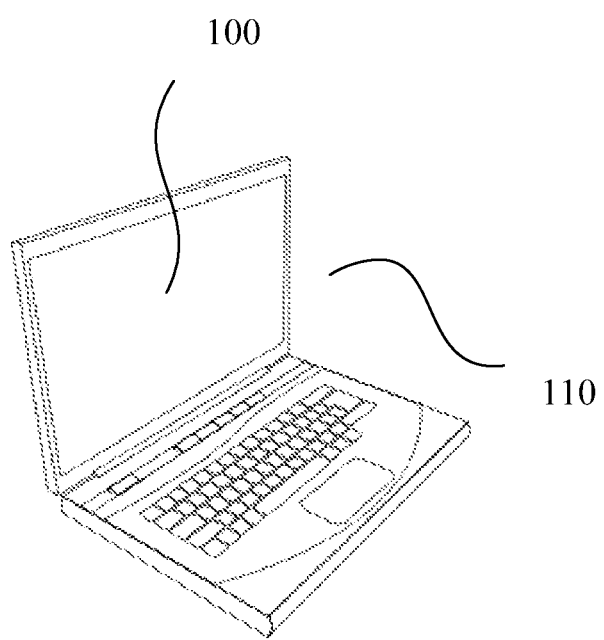
FIG. 11 is a structure diagram of a display device according to an embodiment of the disclosure.

A display device is further provided according to the embodiments of the disclosure, wherein the display device includes the display panel 100 as described above. Reference is made to FIG. 11, which is a structure diagram of the display device 110 according to the embodiment of the disclosure. The display device 110 includes the display panel 100 as described above.

The display device 110 may be a computer, or may be a cell phone or a wearable electronic device with a display function.

In the display panel 100 and the display device 110 including the array substrate 10 according to the embodiments of the disclosure, light leakage of the aperture region of the common electrode is avoided, and the display quality is improved; the width of the aperture region may be wider as compared to existing structures, the process difficulty decreases, and the short-circuit problem of the common electrodes on both sides of the aperture region is avoided.

Figure 12:
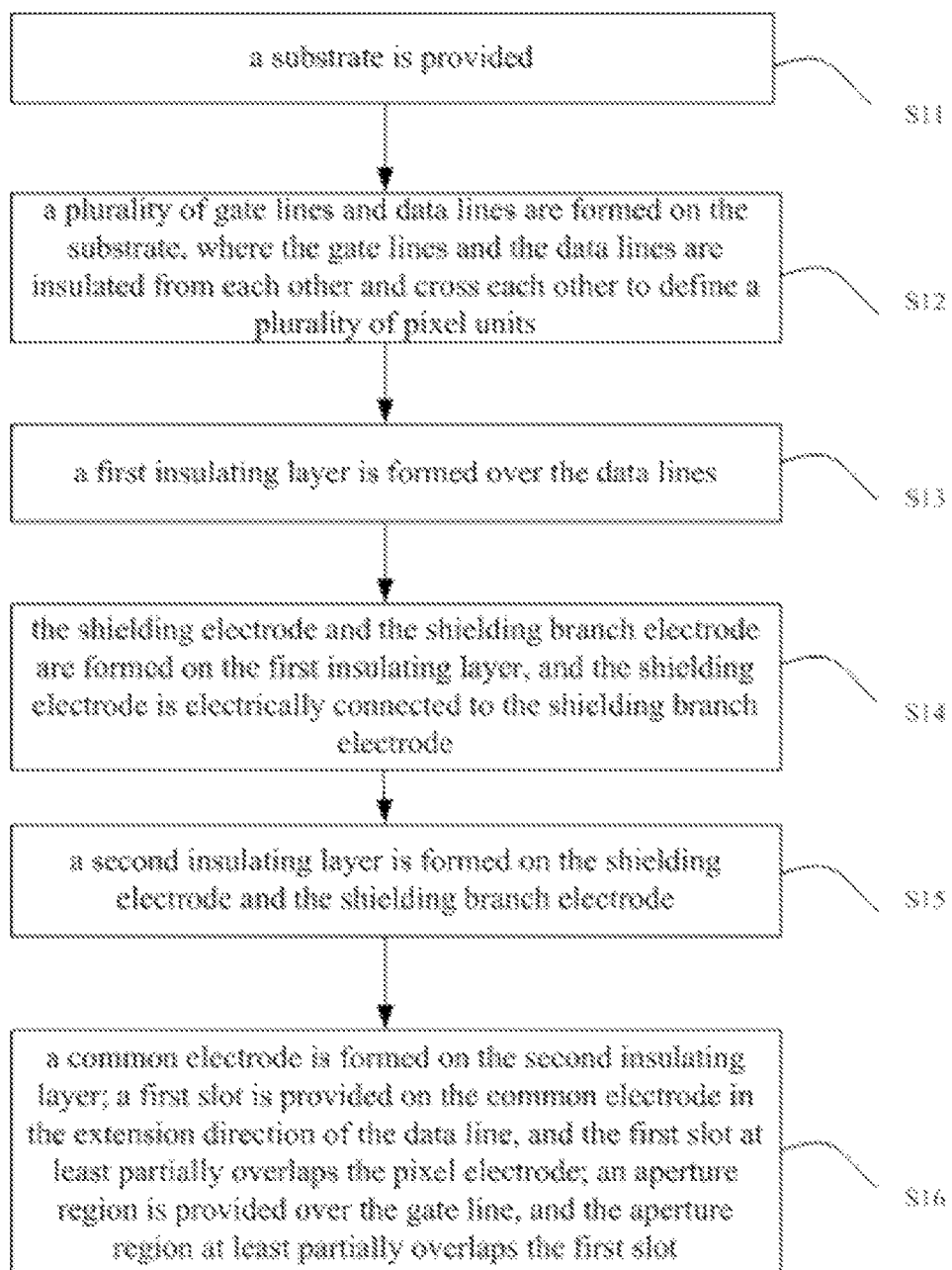
FIG. 12 is a flow chart of a method for manufacturing an array substrate according to an embodiment of the disclosure.

A method for manufacturing an array substrate is further provided according to the embodiments of the disclosure. Reference is made to FIG. 12, which is a flow chart of the method for manufacturing an array substrate according to an embodiment of the disclosure. The manufacture method includes steps S11 to S16.

In step S11, a substrate is provided.

The substrate is a transparent substrate, such as a glass plate.

In step S12, a plurality of gate lines and data lines are formed on the substrate, wherein the gate lines and the data lines are insulated from each other and cross each other to define a plurality of pixel units.

Referring to the implementation in FIG. 1, the plurality of pixel units are arranged in an array. The pixel units include pixel electrodes and common electrodes.

In step S13, a first insulating layer is formed over the data lines.

The first insulating layer may be formed by oxidation or deposition process. Depending on the specific structure of the pixel units, the first insulating layer may be a single-layered insulating layer or a multilayered insulating layer. According to the implementation shown in FIG. 3, the insulating layers 32 and 33 are provided between the data line D3 and the shielding electrode M31, and the first insulating layer in this case is a double-layered insulating layer. According to the implementation shown in FIG. 7, the insulating layer 72 is provided between the data line D3 and the shielding electrode M31, and the first insulating layer in this case is a single-layered insulating layer.

In step S14, the shielding electrode and the shielding branch electrode are formed on the first insulating layer, and the shielding electrode is electrically connected to the shielding branch electrode.

In step S15, a second insulating layer is formed on the shielding electrode and the shielding branch electrode.

No matter in the case that the pixel electrodes are located between the substrate and the common electrodes, or in the case that the common electrodes are located between the substrate and the pixel electrodes, the second insulating layer is usually a single-layered insulating layer. According to the implementation shown in FIG. 3, the insulating layer 34 is formed between the shielding electrode M31 and the common electrode layer 21, and according to the implementation shown in FIG. 7, the insulating layer 74 is formed between the shielding electrode M31 and the common electrode layer 61.

In step S16, a common electrode is formed on the second insulating layer; a first slot is provided on the common electrode in the extension direction of the data line, and the first slot at least partially overlaps the pixel electrode; an aperture region is provided over the gate line, and the aperture region at least partially overlaps the first slot.

The first slot and the data line are separated from each other and would not overlap with each other, to avoid the leakage of the electric field of the data line and light leakage of the display panel.

The projection of the shielding electrode onto the data line overlaps the data line; the shielding branch electrode is provided in the aperture region, and the projection of the shielding branch electrode onto the gate line partially overlaps the gate line. The shielding branch electrode is used to avoid the leakage of the electric field of the gate line under the aperture region and to avoid light leakage of the display panel.

A first via hole is formed in the second insulating layer, and the common electrode layer is electrically connected to the shielding branch electrode through the first via hole. The shielding branch electrode or the shielding electrode is used as the signal line of the common electrode to be used for touch driving or display driving.

Before the step of forming the first insulating layer over the data lines, the method further includes the following: gate electrodes electrically connected to the gate lines are formed on the substrate, a gate insulating layer is formed on the gate electrodes, an active layer is formed on gate insulating layer, and source electrodes, drain electrodes, and the metal layer on which the data lines locate are formed on the active layer, pixel electrodes are formed on the source electrodes, the drain electrodes and the metal layer on which the data lines locate, the pixel electrodes are electrically connected to the drain electrodes, and the first insulating layer is formed on the pixel electrodes.

According to the implementation of the disclosure, the pixel electrodes are provided between the common electrodes and the substrate; the method according to the implementation may be used to manufacture the array substrate with the structure shown in FIG. 2-FIG. 5, and it is required in the implementation that the common electrodes are formed into strip electrode structures.

The specific process includes: forming gate lines and a metal layer, on which the gate lines locate, on the surface of the substrate, patterning the metal layer to form the gate lines and the gate electrodes electrically connected to the gate lines, forming a gate insulating layer on the gate electrodes, forming an active layer on the gate insulating layer, forming source electrodes and drain electrodes as well as the metal layer, on which the data lines locates, on the active layer, forming pixel electrodes on the source electrodes and drain electrodes as well as the metal layer on which the data lines locate, wherein the pixel electrodes are electrically connected to the drain electrodes, and forming the first insulating layer on the pixel electrodes.

The above is just one implementation according to the embodiments of the disclosure, and in another implementation, before the step of forming the first insulating layer over the data lines, the method further includes: forming gate electrodes electrically connected to the gate lines on the substrate, forming the gate insulating layer on the gate electrodes, forming the active layer on the gate insulating layer, forming on the active layer source electrodes and drain electrodes as well as the metal layer on which the data lines locate, forming the first insulating layer on the source electrodes and drain electrodes as well as metal layer on which the data lines locate.

After the step of forming common electrodes on the second insulating layer, the following are included: forming a third insulating layer on the common electrode layer, and forming the pixel electrodes on the third insulating layer, wherein a second via hole is formed on each of the first, second and third insulating layers, and the pixel electrode is electrically connected to the drain electrode through the second via hole.

According to the implementation, common electrodes are provided between the substrate and pixel electrodes; and the method according to the implementation may be used to manufacture the array substrate with the structure shown in FIG. 6-FIG. 9, and it is required in this implementation that the pixel electrodes are formed into strip electrode structure according to the implementation of the disclosure.

The specific process includes: forming on the surface of the substrate gate lines and a metal layer on which the gate lines locate, patterning the metal layer to form the gate lines and the gate electrodes electrically connected to the gate lines, forming a gate insulating layer on the gate electrodes, forming an active layer on the gate insulating layer, forming on the active layer source electrodes and drain electrodes as well as a metal layer on which the data lines locate, forming the first insulating layer on the source electrodes and drain electrodes as well as the metal layer on which the data lines locate; then after steps S14, S15 and S16, forming a third insulating layer on the common electrode layer, and forming the pixel electrodes on the third insulating layer.

In the above-mentioned embodiments, the first slot K1 in the common electrode layer is provided in the region facing the pixel unit, rather than being provided between the pixel units in the conventional art, thus the configuration that the aperture portion facing the data line is avoided. Further, the aperture region K2 is provided over the gate line and the second slot is provided in the common electrode in the extending direction of the gate line. The common electrode is partitioned in the direction of the gate line by the second slot to achieve the time divisional driving of the touch and display.

However, in certain embodiments, the second slot may be the same as the aperture region K2, i.e., the second slot may be referred as K2. On the other hand, along a direction perpendicular to the array substrate, a projection of the first slot on the array substrate may be at least partially overlapped with a projection of the data line on the array substrate, or may be at least partially overlapped with a projection of the pixel electrode on the array substrate, or may be at least partially overlapped with the projection of the data line on the array substrate and the projection of the pixel electrode on the array substrate at the same time. That is, a projection of the first slot on the array substrate may be at least partially overlapped with at least one of a projection of the data line on the array substrate and a projection of the pixel electrode on the array substrate.

Further, the insulating layer coated on the shielding branch electrode M32 and the shielding electrode M31 may be formed by inorganic insulating materials, which may include, for example, one or more of a silicon oxide film, a silicon nitride film, a silicon nitride oxide film, an aluminum oxide film or a titanium oxide film. Due to the inorganic insulating material properties, the insulating layer may not function as planarization film after being disposed on the shielding branch electrode M32 and the shielding electrode M31. That is, the areas of the insulating layer, where the shielding branch electrode M32 and the shielding electrode M31 are embedded, may be raised compared to the other areas of the insulating layer without the embedded shielding branch electrode M32 and the shielding electrode M31. Accordingly, the array substrate may exhibit some raised areas.

When such an array substrate is aligned and attached to an opposite substrate, which may include a plurality of photo spacers, to form a display panel, the photo spacer may be attached to or disposed onto the raised areas of the array substrate where the shielding branch electrodes are embedded. Along the direction perpendicular to the array substrate, the projection of the shielding branch electrodes onto the array substrate may be at least partially overlapped with the projection of the photo spacers onto the array substrate.

Thus, through attaching the photo spacers onto the raised areas of the array substrate where the shielding branch electrodes are embedded, rather than randomly attaching the photo spacers onto the array substrate, a cell gap non-uniformity in the display panel may be avoided, i.e., a uniform cell gap may be realized across the display panel. Accordingly, uniform and stable electro-optical (EO) characteristics across the display panel may be maintained, and high-quality images may be always displayed on the display panel.

Figure 25:
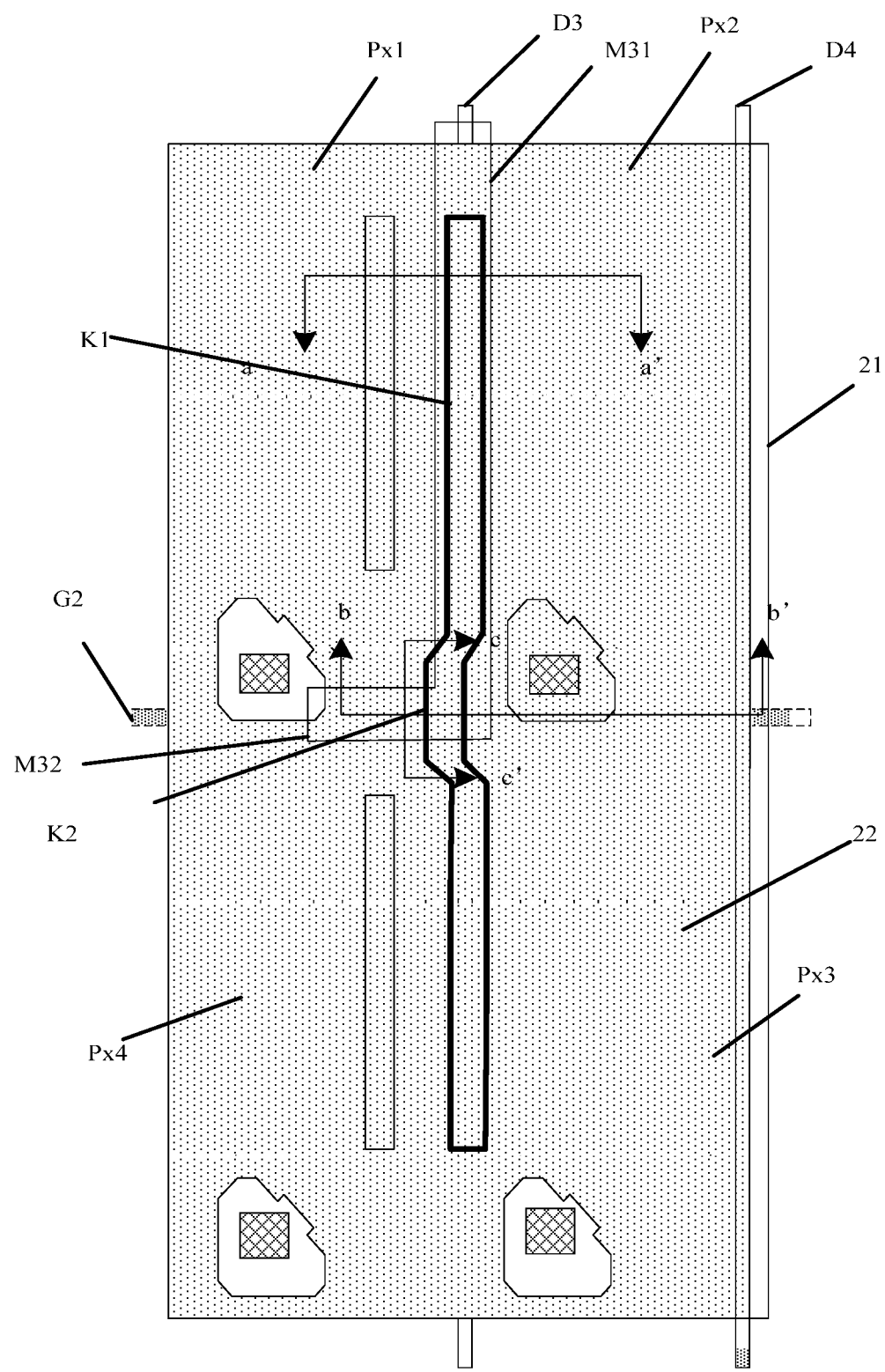
FIG. 25 is an enlarged partial view of another exemplary pixel unit structure of the array substrate shown in FIG. 1.

FIG. 25 is an enlarged partial view of another exemplary pixel unit structure of the array substrate shown in FIG. 1. The similarities between FIG. 2 and FIG. 25 are not repeated here, while certain differences may be further illustrated. Referring to FIG. 1 and FIG. 25, in the first pixel-unit group 14, at least one first slot K1 along the extension direction of the data line D3 may be formed in the common electrode layer 21 in the extension direction of the data line D3 and disposed above the data line D3. In particular, along a direction perpendicular to the array substrate, a projection of the first slot K1 on the array substrate may be at least partially overlapped with at least one of a projection of the data line D3 on the array substrate and a projection of the pixel electrode Px1 on the array substrate.

For example, in one embodiment, as show in FIG. 25, along the direction perpendicular to the array substrate, the projection of the first slot K1 on the array substrate may be at least partially overlapped with the projection of the data line D3 on the array substrate. In another embodiment, the projection of the first slot K1 on the array substrate may be at least partially overlapped with a projection of the pixel electrode Px1 on the array substrate. In another embodiment, the projection of the first slot K1 on the array substrate may be at least partially overlapped with the projection of the data line D3 on the array substrate and the projection of the pixel electrode Px1 on the array substrate at the same time.

The first slot K1 formed in the common electrode layer 21 may correspond to at least one pixel unit. In one embodiment, the common electrode of each pixel unit may be disposed with one first slot K1, i.e., each pixel unit may correspond to one first slot K1. In another embodiment, the common electrodes for one or more predetermined pixel units may be disposed with one first slot K1, i.e., one or more predetermined pixel units may correspond to one first slot K1. For example, as shown in FIG. 25, a plurality of continuous pixel units arranged in a column direction of the pixel unit array may correspond to one first slot K1. In another embodiment, the pixel units in a same column of pixel units (i.e., a same pixel unit column) may correspond to one first slot K1.

Further, at least one second slot K2 along the extending direction of the gate line G2 may be formed in the common electrode layer 21 and disposed over the gate line G2, and the second slot K2 may be at least partially overlapped with the first slot K1. The common electrode layer 21 may be partitioned in the direction of the gate line 11 by the at least one second slot K2 and partitioned in the direction of the data line 12 by the at least one first slot K1, obtaining a plurality of common electrode blocks.

The common electrode blocks may be configured to achieve a touch driving and a display driving through, e.g., a time-multiplexing driving method. That is, the common electrode blocks or the common electrode layer 21 may be multiplexed as a common electrode for the display driving and a touch electrode for the touch driving.

At least one shielding electrode M31 along the extension direction of the data line D3 may be disposed above the data line D3, and at least one shielding branch electrode M32 along the extension direction of the gate line G2 may be disposed above the gate line G2. The shielding branch electrode M32 may be electrically connected to the shielding electrode M31. In particular, along the direction perpendicular to the array substrate, the projection of the shielding electrode M31 onto the data line D3 may be at least partially overlapped with the data line D3, and the projection of the shielding branch electrode M32 onto the gate line G2 may be at least partially overlapped with the gate line G2.

In one embodiment, along the direction perpendicular to the array substrate, the pixel electrode may be disposed between the shielding branch electrode M32 (the shielding electrode M31) and the data lines, and the common electrode layer may be disposed above the pixel electrodes. That is, the shielding branch electrode M32 may be disposed below the common electrodes but above the pixel electrode.

To generate a controllable electric field between the pixel electrode and the common electrode to drive a display medium, for example, a liquid crystal layer, the common electrode layer 21 may have to be etched to form an electrode structure including a plurality of sub-electrodes 22, and each pixel unit may be controlled by a thin-film-transistor (TFT). The sub-electrodes 22 may have various shapes, such as striped electrodes, and zig-zag electrodes, etc.

Figure 13:
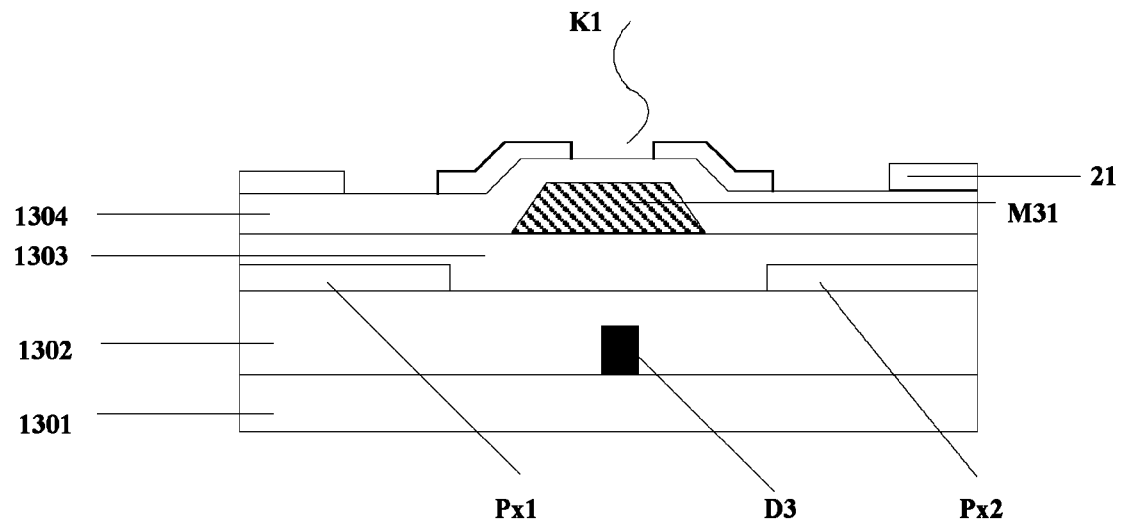
FIG. 13 is an aa' sectional-view of an exemplary array substrate in FIG. 25 according to an embodiment of the disclosure.
Figure 14:
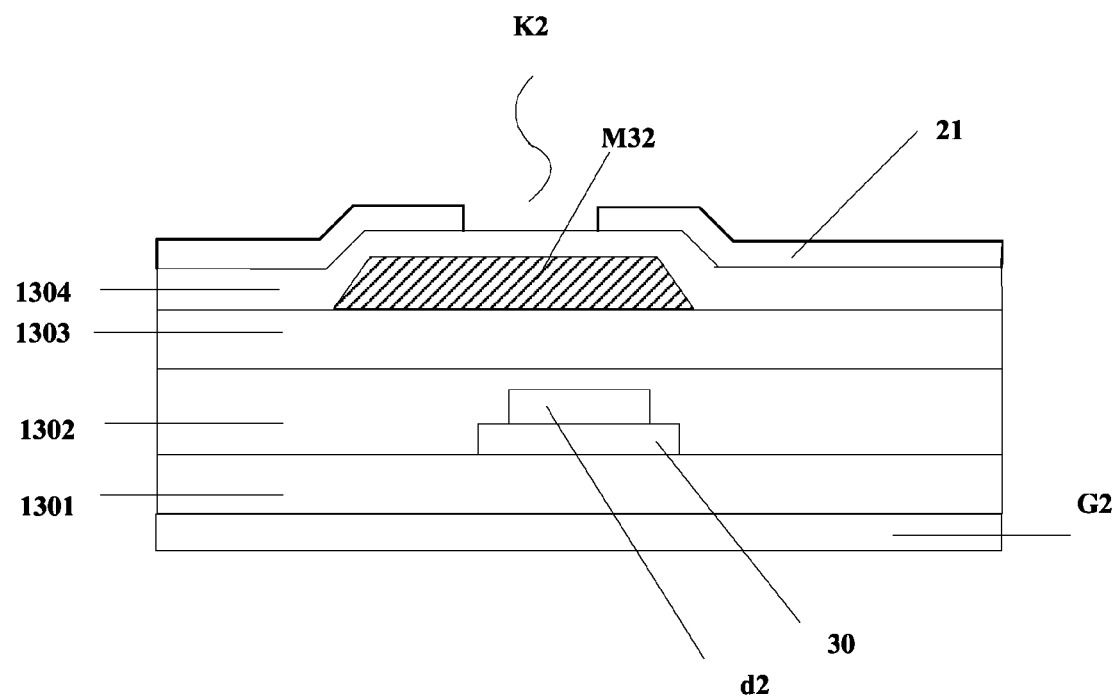
FIG. 14 is a bb' sectional view of an exemplary array substrate in FIG. 25 according to an embodiment of the disclosure.
Figure 15:
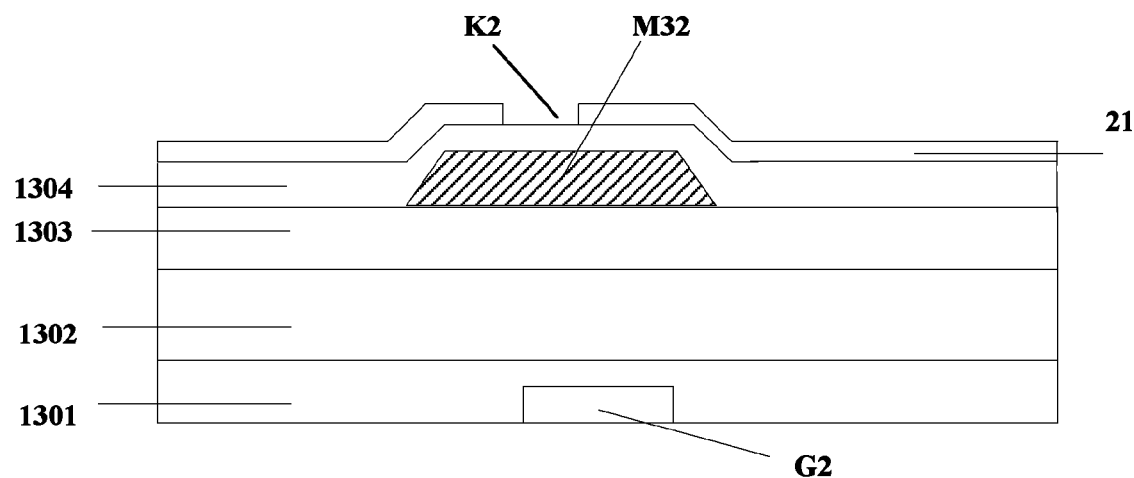
FIG. 15 is a cc' sectional view of an exemplary array substrate in FIG. 25 according to an embodiment of the disclosure.

FIG. 13 illustrates an aa' sectional-view of an exemplary array substrate in FIG. 25 according to an embodiment of the disclosure. FIG. 14 illustrates a bb' sectional view of an exemplary array substrate in FIG. 25 according to an embodiment of the disclosure. FIG. 15 illustrates a cc' sectional view of an exemplary array substrate in FIG. 25 according to an embodiment of the disclosure.

As shown in FIGS. 13-15, in the first pixel-unit group 14, the gate line G2 may be disposed on the substrate (i.e., the base substrate 10 shown in FIG. 1, not drawn in FIGS. 3-5), and the gate line G2 may be covered with a gate insulating layer 1301. An active layer 30, a drain electrode d2 of the TFT of the second pixel unit P2, and a metal layer having the data lines D3 and D4, may be disposed on a surface of the gate insulating layer 1301 away from the substrate.

An insulating layer 1302 may be disposed on the drain electrode d2 and the data lines D3 and D4. The pixel electrode Px1 of the first pixel unit P1 may be disposed on the insulating layer 1302 within an area corresponding to the first pixel unit P1, and the pixel electrode Px2 of the second pixel unit P2 may be disposed on the insulating layer 1302 within an area corresponding to the second pixel unit P2.

In one embodiment, at least one third via hole Via3 (not drawn in FIGS. 13-15) may be disposed in the insulating layer 1302, such that the electrical connection between the pixel electrode and the drain electrode d2 of the TFT may be realized through the third via hole Via1. In another embodiment, the insulating layer 1302 may be omitted, and the electrical connection between the pixel electrode and the drain electrode d2 of the TFT may be realized by overlapping a certain portion of the pixel electrode to the drain electrode d2 of the TFT, while the remained portion of the pixel electrode may be in the same layer as the drain electrode d2 of the TFT.

Further, an insulating layer 1303 may be disposed on the pixel electrode Px1 and the pixel electrode Px2. The shielding electrode M31 and the shielding branch electrode M32 may be disposed on a surface of the insulating layer 1303 away from the pixel electrodes Px1 and Px2. An insulating layer 1304 may be disposed on the shielding electrode M31 and the shielding branch electrode M32, and the common electrode layer 21 may be disposed on a surface of the insulating layer 1304 away from the shielding electrode M31 and the shielding branch electrode M32. The common electrodes may include a plurality of strip electrodes 22 in the regions corresponding to the pixel units. At least one fourth via hole Via4 (not drawn in FIGS. 13-15) may be disposed in the insulating layer 1304, such that the common electrode 21 may be electrically connected to the shielding branch electrode M32 through the fourth via hole Via4.

Further, the at least one first slot K1 may be disposed in the common electrode layer 21 corresponding to the pixel electrode Px1, and the second slot K2 may be disposed in the common electrode layer 21 over the gate line G2 between the pixel electrodes Px1 and Px4. Along the direction perpendicular to the array substrate, the projection of the at least one first slot K1 on the array substrate may be at least partially overlapped with the projection of the pixel electrode Px1 on the array substrate. In addition, the projection of the shielding electrode M31 onto the data line D3 may be at least partially overlapped with the data line D3, and the projection of the shielding branch electrode M32 onto the gate line G2 may be at least partially overlapped with the gate line G2.

The insulating layer 1304 may include one or more of a silicon oxide film, a silicon nitride film, a silicon nitride oxide film, an aluminum oxide film or a titanium oxide film. Further, the insulating layer 1304 may be films formed by other inorganic insulating materials which have a same or similar property as the above-mentioned films.

Due to the inorganic insulating material properties, the insulating layer 1304 may not function as planarization film after being disposed on the shielding branch electrode M32 and the shielding electrode M31. That is, the areas of the insulating layer 1304, where the shielding branch electrode M32 and the shielding electrode M31 are embedded, may be raised compared to the other areas of the insulating layer 1304 without the embedded shielding branch electrode M32 and the shielding electrode M31.

The thickness of the shielding electrode M31, the shielding branch electrode M32, the insulating layer 1304, the common electrode layer 21, and the pixel electrode may be determined according to the fabrication process and application scenarios. In one embodiment, the thickness of the shielding electrode M31, the shielding branch electrode M32 and the insulating layer 1304 may be approximately 3000 A, respectively. The thickness of the common electrode layer 21 and the pixel electrode may be approximately 700 A, respectively. The areas of the insulating layer 1304 with the embedded shielding branch electrode M32 may be approximately 2800 A higher than the other areas of the insulating layer 1304 without the embedded shielding branch electrode M32.

In another embodiment, along the direction perpendicular to the array substrate, the common electrode may be disposed between the shielding branch electrode M32 (the shielding electrode M31) and the data line 12, and the common electrode may be disposed over the pixel electrode. That is, the shielding branch electrode M32 may be disposed above the common electrodes but below the pixel electrode. In addition, to generate a controllable electric field between the pixel electrode and the common electrode to drive a display medium, for example, a liquid crystal layer, each pixel electrode may be etched to form an electrode structure including a plurality of sub-electrodes, and each common electrode may be fabricated into one or more sub-electrodes. The sub-electrodes may have various shapes, such as striped electrodes, and zig-zag electrodes, etc. The corresponding array substrate is shown in FIGS. 16-19 and 26

Figure 26:
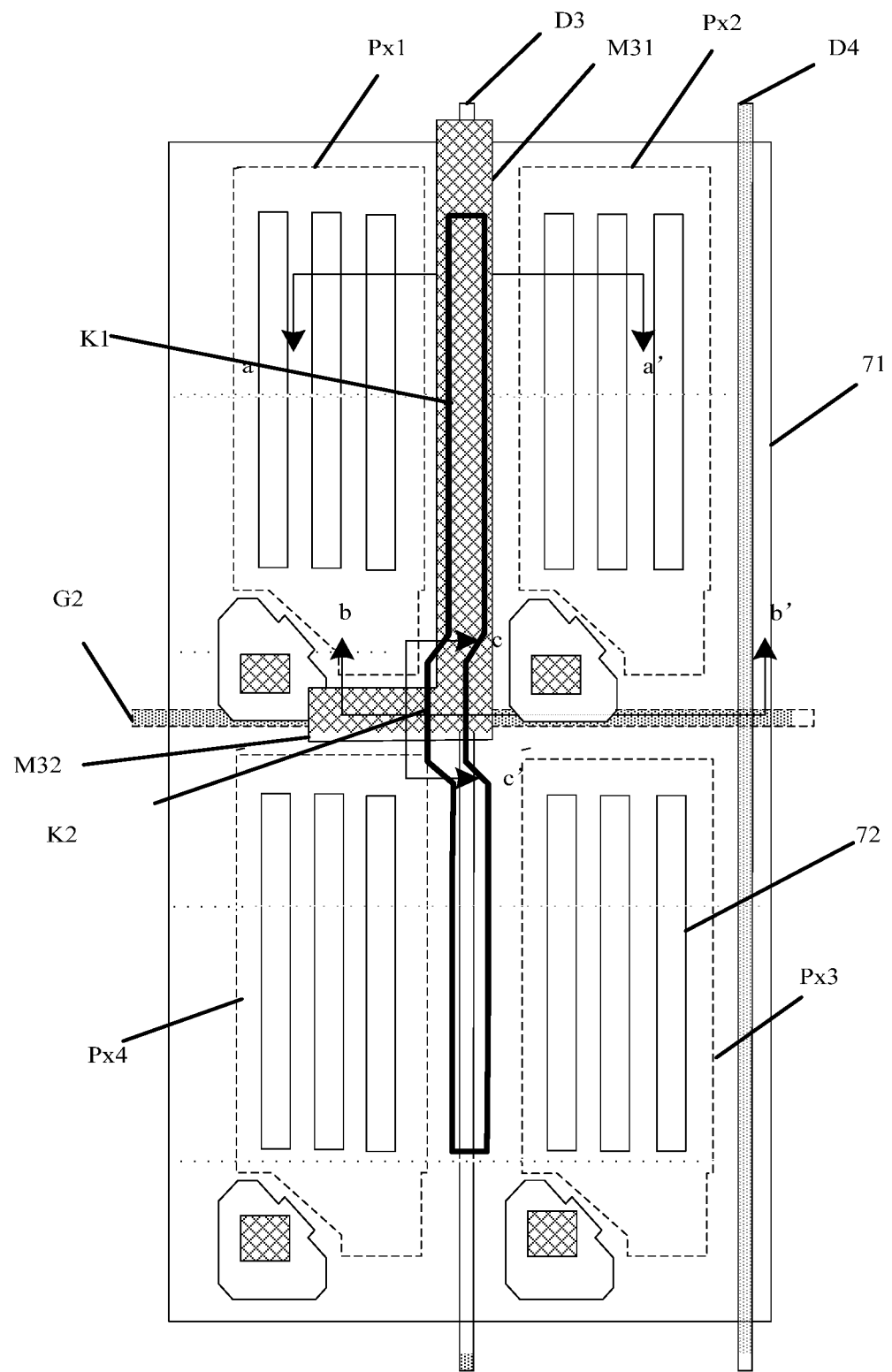
FIG. 26 is an enlarged partial view of another exemplary pixel unit structure of the array substrate shown in FIG. 1.

FIG. 26 is an enlarged partial view of another exemplary pixel unit structure of the array substrate shown in FIG. 1. The similarities between FIG. 2 and FIG. 26 are not repeated here, while certain differences may be further illustrated. Referring to FIG. 1 and FIG. 26, in the first pixel-unit group 14, at least one first slot K1 along the extension direction of the data line D3 may be formed in a common electrode layer 21 in the extension direction of the data line D3 and disposed above the data line D3. In particular, along a direction perpendicular to the array substrate, a projection of the first slot K1 on the array substrate may be at least partially overlapped with at least one of a projection of the data line D3 on the array substrate and a projection of the pixel electrode Px1 on the array substrate.

For example, in one embodiment, as show in FIG. 26, along the direction perpendicular to the array substrate, the projection of the first slot K1 on the array substrate may be at least partially overlapped with the projection of the data line D3 on the array substrate. In another embodiment, the projection of the first slot K1 on the array substrate may be at least partially overlapped with a projection of the pixel electrode Px1 on the array substrate. In another embodiment, the projection of the first slot K1 on the array substrate may be at least partially overlapped with the projection of the data line D3 on the array substrate and the projection of the pixel electrode Px1 on the array substrate at the same time.

Figure 16:
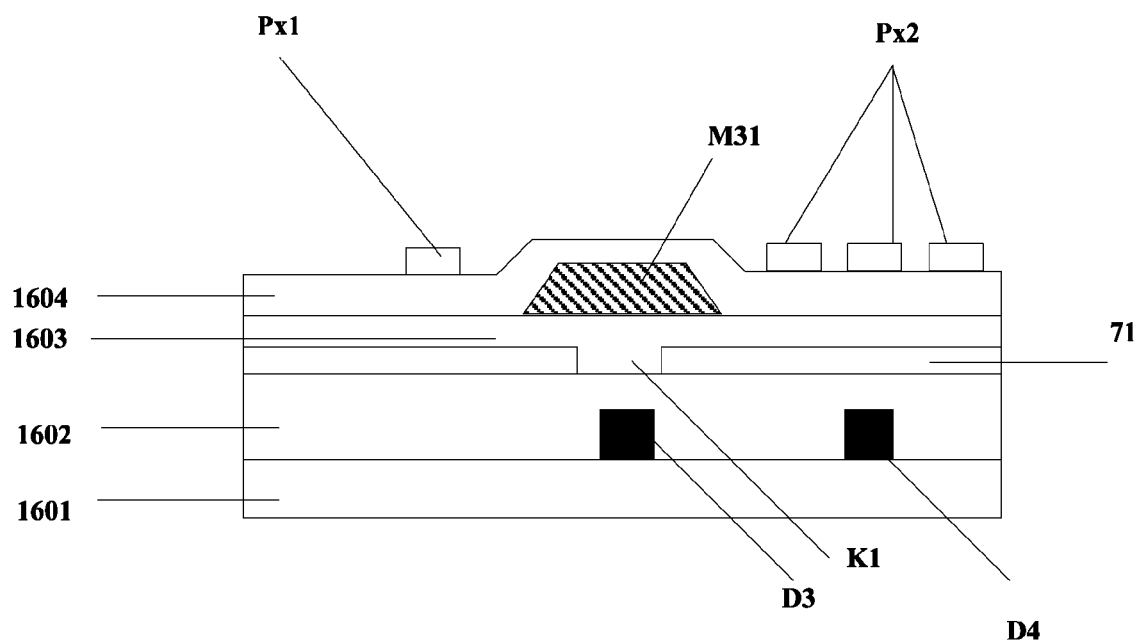
FIG. 16 is an aa' sectional-view of an exemplary array substrate in FIG. 26 according to an embodiment of the disclosure.
Figure 17:
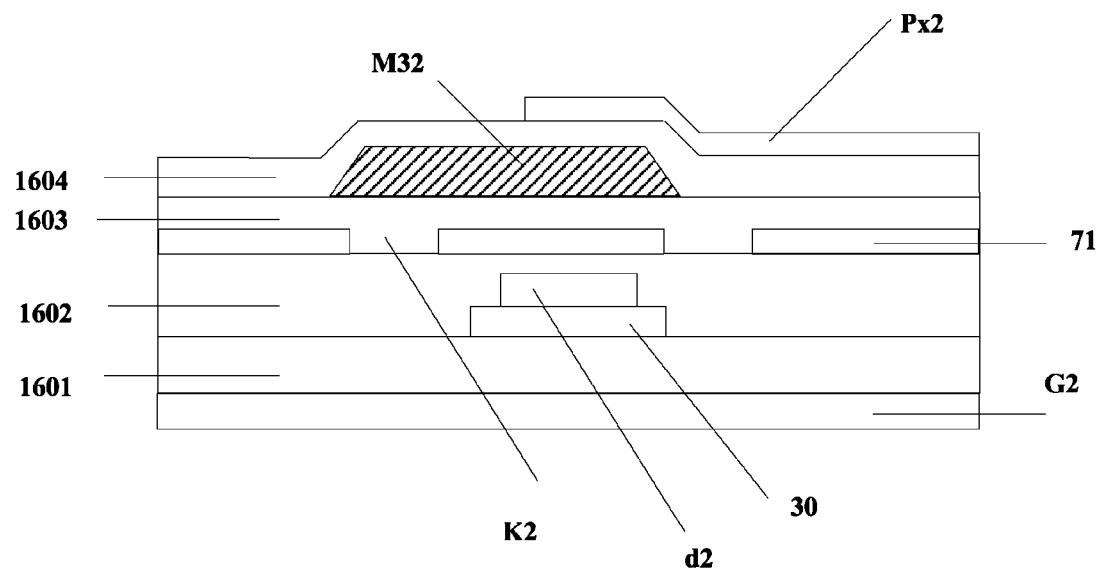
FIG. 17 is a bb' sectional view of an exemplary array substrate in FIG. 26 according to an embodiment of the disclosure.
Figure 18:
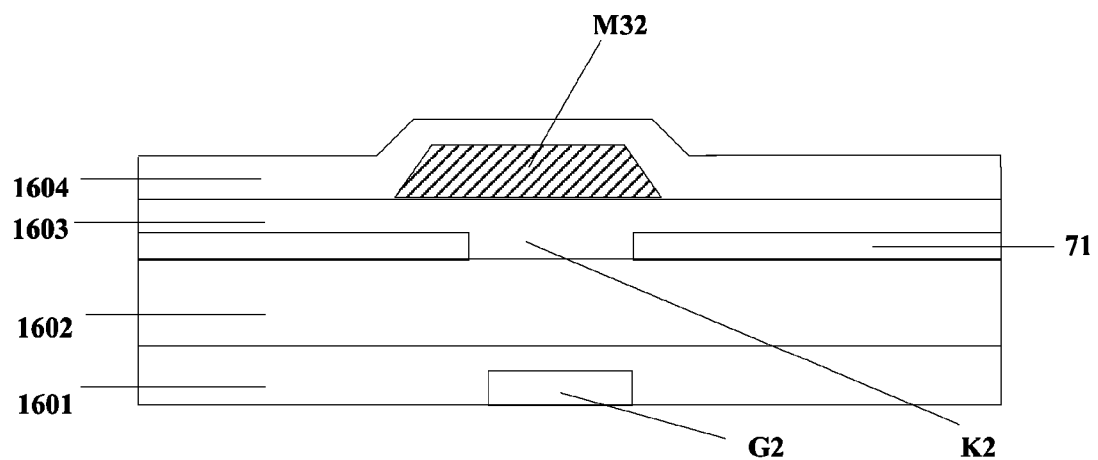
FIG. 18 is a cc' sectional view of an exemplary array substrate in FIG. 26 according to an embodiment of the disclosure.

FIG. 16 illustrates an aa' sectional-view of an exemplary array substrate in FIG. 26 according to an embodiment of the disclosure. FIG. 17 illustrates a bb' sectional view of an exemplary array substrate in FIG. 26 according to an embodiment of the disclosure. FIG. 18 illustrates a cc' sectional view of an exemplary array substrate in FIG. 26 according to an embodiment of the disclosure. The similarities between FIGS. 13-15 and FIGS. 16-18 are not repeated here, while certain differences may be further illustrated.

As shown in FIGS. 16-18, in the first pixel-unit group, the gate line G2 may be disposed on the substrate (i.e., the base substrate 10 shown in FIG. 1, not drawn in FIGS. 16-18), and the gate line G2 may be covered with a gate insulating layer 1601. The active layer 30, the drain electrode d2 of the TFT of the second pixel unit P2, and a metal layer having the data lines D3 and D4, may be disposed on a surface of the gate insulating layer 1601 away from the substrate.

An insulating layer 1602 may be disposed on the drain electrode d2 and the data lines D3 and D4. The common electrode layer 71 may be disposed on a surface of the insulating layer 1602 away from the drain electrode d2 and the data lines D3 and D4. The first slot K1 may be disposed in a region of the common electrode layer 71 corresponding to the first pixel unit P1, and the second slot K2 may be disposed in a region of the common electrode layer 71 over the gate line G2 between the pixel electrodes Px1 and Px4.

An insulating layer 1603 may be disposed on the common electrode layer 71. The shielding electrode M31 and the shielding branch electrode M32 may be disposed on a surface of the insulating layer 1603 away from the common electrode layer 71. In particular, the projection of the shielding electrode M31 onto the data line D3 may be at least partially overlapped with the data line D3. The projection of the shielding branch electrode M32 onto the gate line G2 may be at least partially overlapped with the gate line G2.

To realize an electrical connection between the common electrode layer 71 and the shielding branch electrode M32 (or the shielding electrode M31), at least one fifth via hole Via5 (not drawn in FIGS. 16-18) may be disposed in the insulating layer 1603. That is, the insulating layer 1603 may be electrically connected to the shielding branch electrode M32 or the shielding electrode M31 through the fifth via hole Via5.

Further, an insulating layer 1604 may be disposed on the shielding electrode M31 and the shielding branch electrode M32, and the pixel electrodes Px1 and Px2 may be disposed on a surface of the insulating layer 1604 away from the shielding electrode M31 and the shielding branch electrode M32. In particular, the pixel electrode Px1 of the first pixel unit P1 may be disposed on the insulating layer 1604 within an area corresponding to the first pixel unit P1, and the pixel electrode Px2 of the second pixel unit P2 may be disposed on the insulating layer 1604 within an area corresponding to the second pixel unit P2.

To realize an electrical connection between the pixel electrode and the drain electrode of the corresponding TFTs, at least one sixth via hole Via6 (not drawn in FIGS. 16-18) may be disposed to pass through the insulating layer 1602, the insulating layer 1603, and the insulating layer 1604, such that the pixel electrode may be electrically connected to the corresponding drain electrode through the sixth via hole Via6.

The insulating layer 1604 may include one or more of a silicon oxide film, a silicon nitride film, a silicon nitride oxide film, an aluminum oxide film or a titanium oxide film. Further, the insulating layer 1604 may be films formed by other inorganic insulating materials which have a same or similar property as the above-mentioned films.

Due to the inorganic insulating material properties, the insulating layer 1604 may not function as planarization film after being disposed on the shielding branch electrode M32 and the shielding electrode M31. That is, the areas of the insulating layer 1604, where the shielding branch electrode M32 and the shielding electrode M31 are embedded, may be raised compared to the other areas of the insulating layer 1604 without the embedded shielding branch electrode M32 and the shielding electrode M31. Accordingly, the areas of the array substrate may also be raised, i.e., the array substrate may exhibit raised areas.

In the disclosed embodiments, the common electrode layer in the array substrate may include at least one first slot extending in the extension direction of the data line and at least one second slot extending in the extension direction of the gate line. The second slot may be at least partially overlapped with the first slot. The projection of the first slot on the array substrate may be at least partially overlapped with at least one of the projection of the data line on the array substrate and the projection of the pixel electrode on the array substrate.

The array substrate may include at least one shielding electrode and at last one shielding branch electrode. Along the direction perpendicular to the array substrate, a projection of the shielding electrode onto the data line may be at least partially overlapped with the data line, and a projection of the shielding branch electrode onto the gate line may be at least partially overlapped with the gate line. Through disposing the shielding electrode above the data line and the shielding branch electrode above the gate line, the electric field leakage of the data line and gate line may be suppressed. Accordingly, the light leakage of the display panel may be also reduced.

In particular, when the projection of the first slot on the array substrate is only at least partially overlapped with the projection of the pixel electrode on the array substrate, the first slot is no longer facing a data line. The electric field leakage of the data line may be further suppressed, and the light leakage of the display panel comprising the disclosed array substrate may be further reduced accordingly.

Moreover, because the second slot in the common electrode layer may be disposed between two adjacent pixel units in a same pixel unit column and disposed above the gate line, the gate line may be only partially exposed. Through disposing the shielding branch electrode above the gate line, the electric field leakage of the data line may be effectively suppressed. In addition, the longitudinal width of the second slot (i.e., the width of the seconds slot along the column direction of the pixel unit array) may be fabricated with a larger aperture width, such that the fabrication difficulty of the second slot may be reduced and, meanwhile, the common electrodes adjacent with respect to the second slot may be prevented from a short-circuit.

Figure 19:
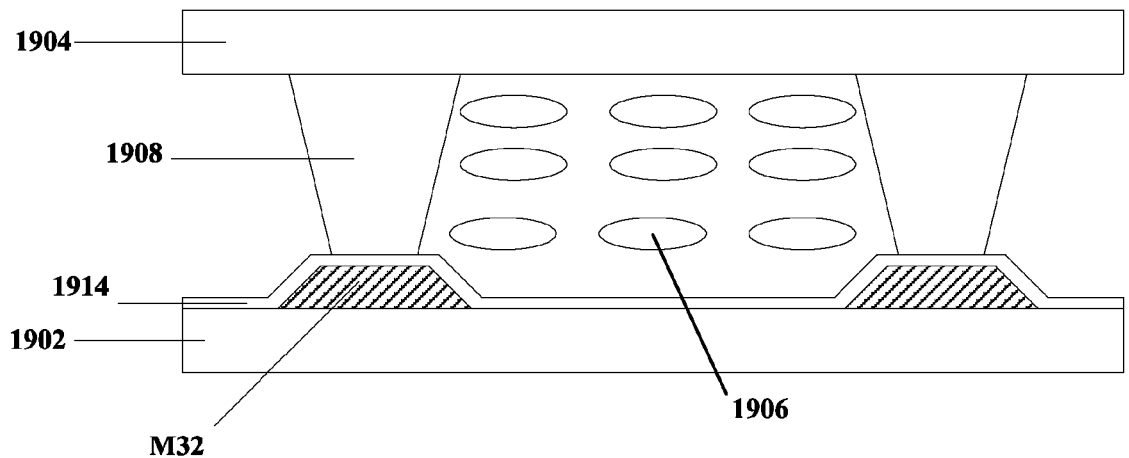
FIG. 19 is a cross-sectional view of another exemplary display panel according to an embodiment of the disclosure.

The present disclosure also provides an improved display panel. FIG. 19 illustrates a cross-sectional view of another exemplary display panel according to an embodiment of the disclosure. As shown in FIG. 19, the display panel 1900 may include an array substrate 1902, an opposite substrate 1904, and display medium 1906 sandwiched between the array substrate and the opposite substrate. The array substrate 1902 may be any one of the disclosed array substrates. The opposite substrate 1904 may include a plurality of photo spacers 1908, which may not only maintain a constant height level at micro-scales and precision level uniformity of cell gap dimensions for the display medium 1906, but also play an important role in providing acceptable elasticity and mechanical properties.

The display panel 1900 may be any appropriate type of display panels capable of displaying videos and/or images, such as plasma display panel (PDP), field emission display (FED) panel, liquid crystal display (LCD) panel, organic light-emitting diode (OLED) display panel, light-emitting diode (LED) display panel, quantum dots (QDs) display panel, electrophoretic display panels (i.e., e-readers) ort other types of display panels.

In one embodiment, as shown in FIG. 19, the opposite substrate 1904 may be a color film substrate 1904, and the display medium 1906 may be liquid crystals. That is, a liquid crystal layer 1906 may be sandwiched between the array substrate 1902 and the color film substrate 1904, and the display panel 1900 may be an LCD panel. In particular, Thin-Film Transistor Liquid Crystal Display (TFT-LCD) Panel is a variant of a liquid crystal display (LCD) panel that uses thin-film transistor (TFT) technology to improve image qualities such as addressability and contrast.

In particular, when the color film substrate 1904 is aligned and attached to the array substrate 1902, one shielding branch electrode M32 may correspond to at least one photo spacer 1908. That is, at least one photo spacer 1908 may be attached onto a raised area of the insulating layer 1914 where the shielding branch electrode M32 is embedded. Along a direction perpendicular to the array substrate 1902, the projection of the shielding branch electrode M32 on the array substrate 1902 may be at least partially overlapped with the projection of the corresponding the photo spacer 1908 on the array substrate 1902.

As discussed above, because of the insulating layer disposed on the shielding branch electrode M32 and the shielding electrode M31, the areas of the insulating layer 1914, where the shielding branch electrode M32 and the shielding electrode M31 are embedded, may be raised compared to the other areas of the insulating layer 1914 without the embedded shielding branch electrode M32 and the shielding electrode M31. That is, the areas of the insulating layer 1914, where the shielding branch electrode M32 and the shielding electrode M31 are embedded, may be higher than the other areas of the insulating layer 1914 without the embedded shielding branch electrode M32 and the shielding electrode M31.

In the disclosed embodiments, through attaching the photo spacers 1908 onto the areas of the insulating layer 1914 where the shielding branch electrodes M32 are embedded, rather than randomly attaching the photo spacers 1908 onto the array substrate 1902, a cell gap non-uniformity in the display panel 1900 may be avoided, i.e., a uniform cell gap may be realized across the display panel. Accordingly, uniform and stable EO characteristics across the display panel 1900 may be maintained.

For illustrative purposes, only certain components of the array substrate 1902 and the opposite substrate 1904 are drawn in FIG. 19. The detail structures of the array substrate 1902 may be referred to FIGS. 1-9, and the detail structures of the color film substrate 1904 may be referred to FIGS. 20-21. It should be noted that, the shape and the number of the photo spacer 1908 and the shape and the number of the shielding branch electrode M32 shown in FIG. 19 are only for illustrative purposes, and are not intended to limit the scope of the present invention.

Figure 20:
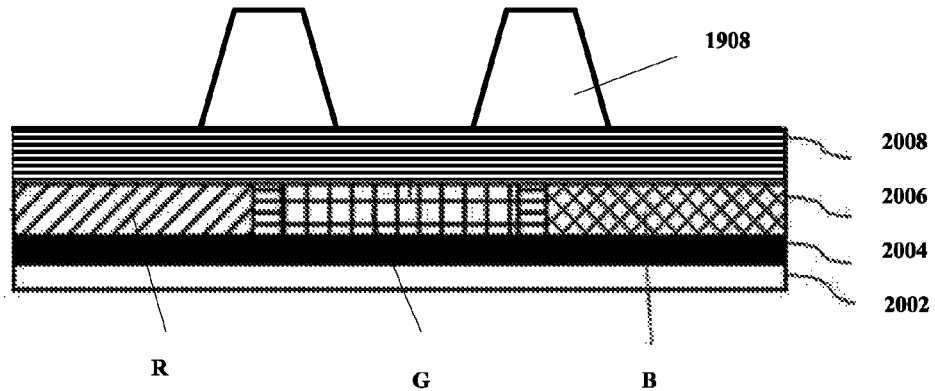
FIG. 20 is a top view of an exemplary color film substrate according to an embodiment of the disclosure.
Figure 21:
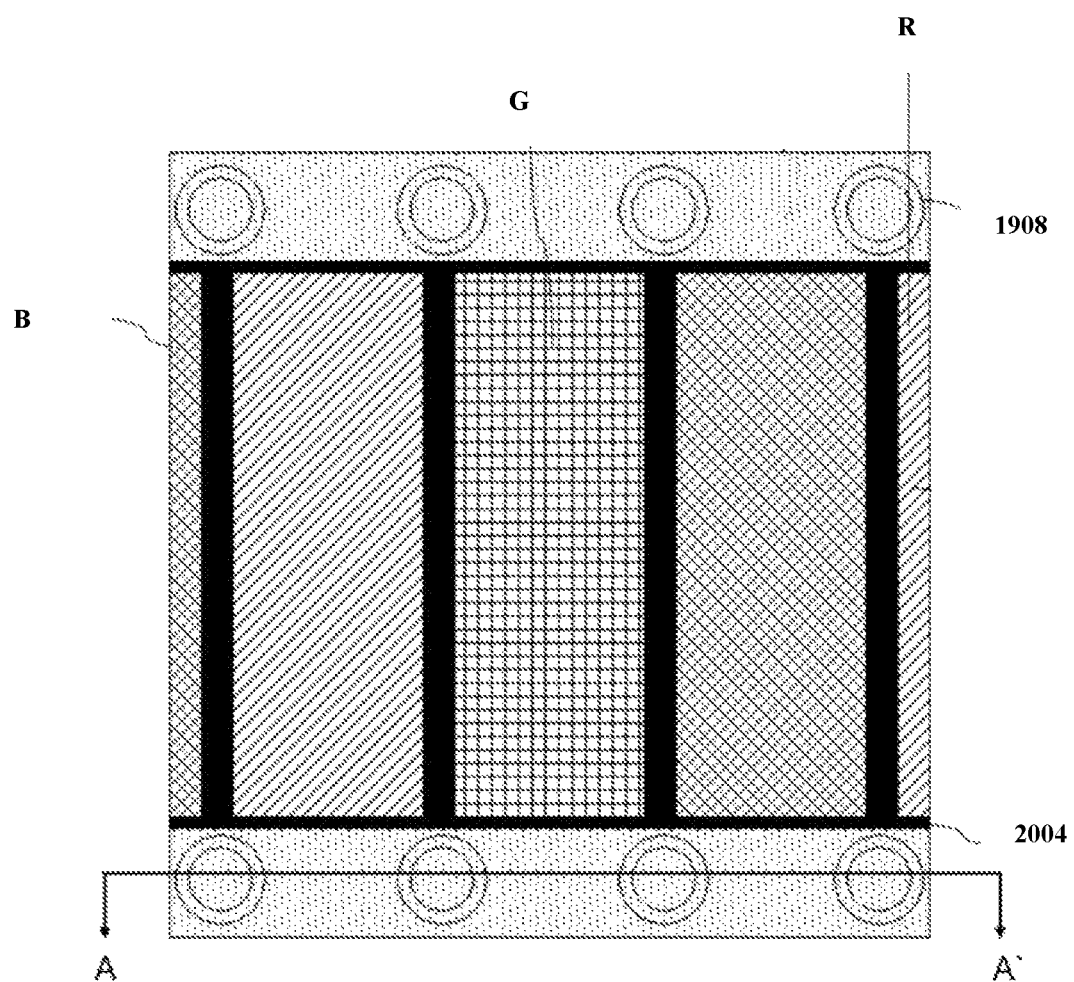
FIG. 21 is an AA' sectional-view of an exemplary color film substrate in FIG. 20 according to an embodiment of the disclosure.

FIG. 20 illustrates a top view of an exemplary color film substrate according to an embodiment of the disclosure. FIG. 21 illustrates an AA' sectional-view of an exemplary color film substrate in FIG. 20 according to an embodiment of the disclosure. As shown in FIG. 20 and FIG. 21, the color film substrate 1904 may include a base substrate 2002, a black matrix 2004, a color barrier layer 2006, a protective layer 2008, and a plurality of photo spacers 1908. Other components may also be included.

The base substrate 2002 may be made of transparent materials, such as glass, flexible transparent plastics (e.g., polyimide), etc. For the flexible transparent plastics, given a high-temperature deposition process on the base substrate 2002, polyimide with excellent heat resistance may be selected as the material for the base substrate 2002.

The black matrix 2004 may be formed on the base substrate 2002, through depositing a black matrix layer on the base substrate 2002, and then exposing and developing the black matrix layer in a photolithographic process. The obtained black matrix 2004 may include a plurality of black matrix stripes, and the black matrix stripes arranged horizontally may intersect the black matrix stripes arranged vertically.

The color barrier layer 2006 may be formed on the black matrix 2004. The color barrier layer 2006 may further include a plurality of color barriers having a plurality of different colors, for example, a plurality of red color barriers (R), a plurality of green color barriers (G), and a plurality of blue color barriers (B). In another embodiment, the color barrier layer 2006 may also include a plurality of white color barriers and/or color barriers having other colors.

The plurality of red color barriers (R), the plurality of green color barriers (G), and the plurality of blue color barriers (B) may be one-to-one corresponding to a plurality of pixel units to form a plurality of red color pixel units (R), a plurality of green color pixel units (G), and a plurality of blue color pixel units (B) in the array substrate, which may be arranged opposite to the color film substrate. The black matrix stripes may be disposed among adjacent color barriers.

The protective layer 2008 may be formed on the black matrix 2004 and the color barrier layer 2006. The protective layer 2008 may be formed by positive photo resists or negative photo resists. The photo spacers 1908 may be formed on the protective layer 2008. In certain embodiments, to maintain a uniform surface pressure in the TFT-LCD under a vertical pressure, each pixel unit may be configured to correspond to one photo spacer 1908.

Further, the photo spacers 1908 formed on the protective layer 2008 may be configured to have a predetermined arrangement through a predesigned patterning process. As shown in FIG. 20, along a direction perpendicular to the color film plate 1004, the projections of the photo spacers 1908 on the black matrix 2004 may fall within the black matrix 2004, i.e., the projection of the photo spacer 1908 may overlap with the black matrix 2004.

Further, as shown in FIG. 21, the photo spacers 1908 may be disposed above the black matrix stripes between two adjacent rows of color barriers. That is, the photo spacers 1908 may be disposed above the black matrix stripes along a row direction of the color barriers, and the projections of the photo spacers 1908 may fall within the black matrix stripes along the row direction of the color barriers.

The black matrix stripes disposed between two adjacent rows of color barriers may a larger width than the black matrix stripes disposed between two adjacent columns of color barriers. That is, the black matrix stripes disposed along the row direction of the color barriers may a larger width than the black matrix stripes disposed along the column direction of the color barriers. Thus, the photo spacers 1908 disposed above the black matrix stripes disposed between two adjacent rows of color barriers may be able to have a larger contact area with the protective layer 2008. That is, the photo spacers 1908 disposed above the black matrix stripes along the row direction of the color barriers may be more supportive and maintain a more constant cell gap.

In the disclosed embodiments, through disposing the photo spacers 1908 above the black matrix stripes along the row direction of the color barriers in the color film substrate 1904 and, meanwhile, attaching the photo spacers 1908 onto the areas of the insulating layer 1914 where the shielding branch electrodes M32 are embedded, a cell gap non-uniformity in the display panel 1900 may be avoided, i.e., a uniform cell gap may be realized across the display panel. Accordingly, the stability of EO characteristics of display panel 1900 may be maintained. Thus, in addition to reduce the light leakage of the display panel and prevent the short-circuit of the common electrodes adjacent with respect to the second slot, the constant height level at micro-scales and precision level uniformity of cell gap of the display panel 1900 may also be effectively maintained, and high-quality images may be constantly realized.

The disclosed display panel may form an improved display device. As discussed above, FIG. 11 illustrates a cross-sectional view of an exemplary display device according to an embodiment of the disclosure. The display device shown in FIG. 11 may also be any appropriate type of display devices including any of the disclosed display panels. For example, the display device 110 may be a tablet, a TV, a smartphone, a notebook, and a smartwatch including any of the disclosed display panel 100, etc. Further, the display device 110 may be any appropriate type of content-presentation devices including any of the disclosed display panel 100. Because the disclosed display device 110 includes the disclosed display panel, the disclosed display device 110 may also exhibit same advantages as the disclosed display panel.

Figure 22:
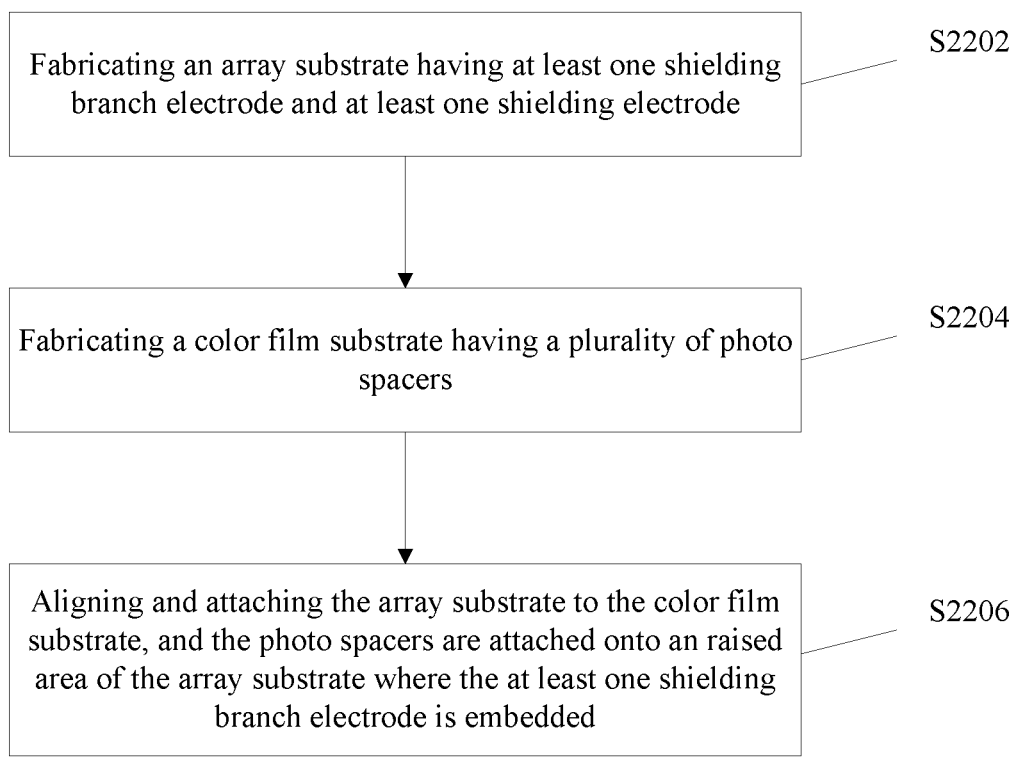
FIG. 22 is a flow chart of an exemplary display panel fabrication process according to an embodiment of the disclosure.

FIG. 22 illustrates a flow chart of an exemplary display panel fabrication process. As shown in FIG. 22, at the beginning, an array substrate having at least one shielding branch electrode and at least one shielding electrode is fabricated (S2202). The corresponding structure is illustrated in FIGS. 25-26 and FIGS. 13-18. In particular, the array substrate may exhibit some raised areas where the shielding branch electrodes are embedded. The fabrication process of the array substrate shown in FIGS. 25-26 and FIGS. 13-18 is explained in FIGS. 23-24.

An opposite substrate having a plurality of photo spacers is fabricated (S2204). In one embodiment, the opposite substrate may be a color film substrate, and the corresponding structure is illustrated in FIGS. 20-21. The array substrates and the color film substrate may be fabricated simultaneously or separately. Then the array substrate and the color film substrate are aligned and attached to each other, in which the photo spacers are attached onto the raised areas of the array substrate where the shielding branch electrodes are embedded (S2206).

In particular, each shielding branch electrode may correspond to at least one photo spacer. Along the direction perpendicular to the array substrate, the projection of the shielding branch electrode onto the array substrate and the projection of the corresponding photo spacer onto the array substrate may be at least partially overlapped. The fabrication process shown in FIG. 22 may also include other steps, for example, after the array substrate and the color film substrate are attached to each other, display medium may be filled in and a cell formed by the two substrates may be sealed by glue, which are not explained here.

It should be noted that, the color film substrate may be fabricated by adopting a current color film substrate fabrication process, as long as when the array substrate and the color film substrate are aligned and attached to each other, the photo spacers are attached onto the raised areas of the array substrate where the shielding branch electrodes are embedded. That is, the cell gap uniformity in the disclosed display panel may be realized without modifying the current fabrication process of the color film substrate. Thus, the current fabrication process of the color film substrate may be still applicable to the disposed display panel.

Figure 23:
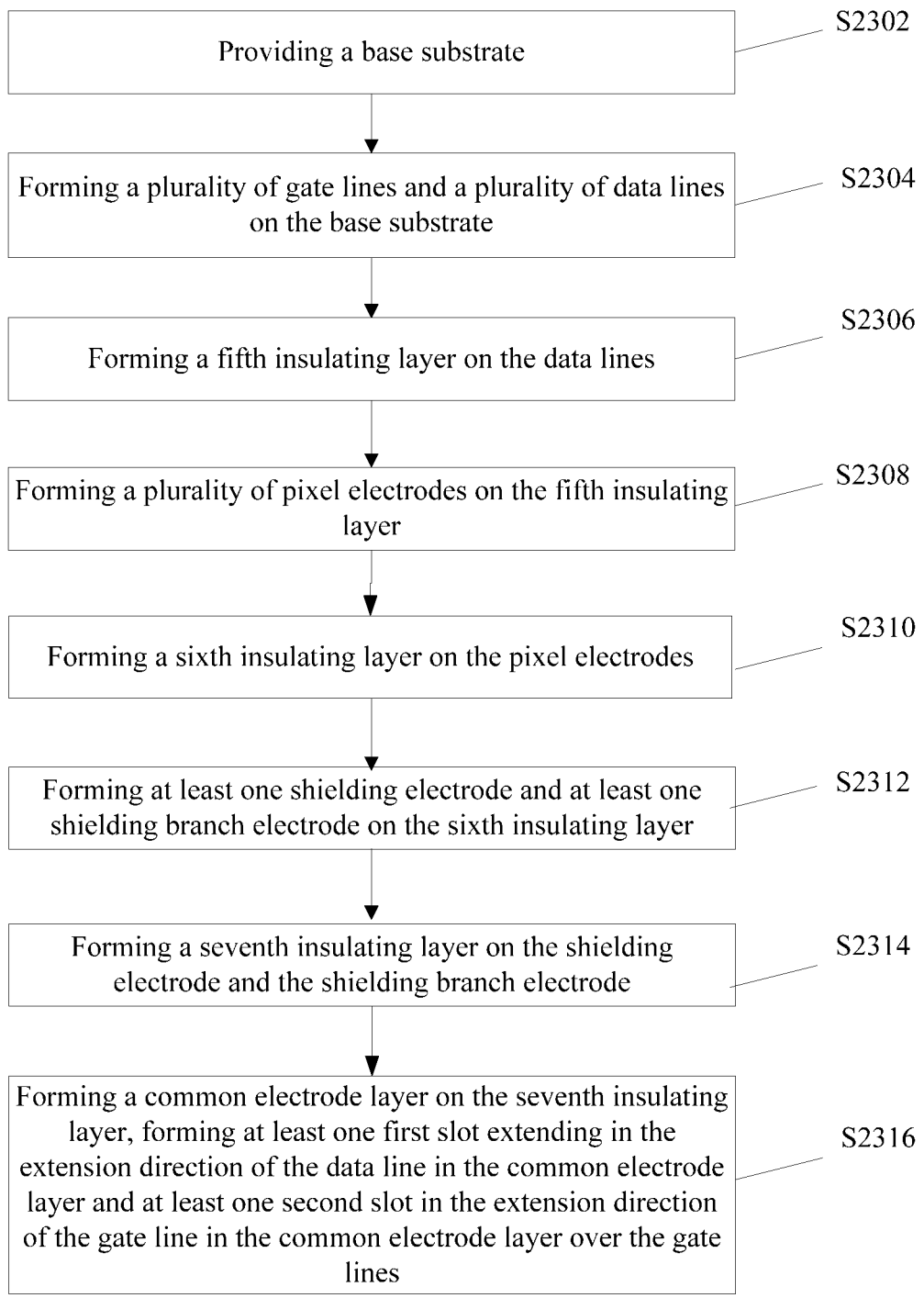
FIG. 23 is a flow chart of another exemplary array substrate fabrication process according to an embodiment of the disclosure.

FIG. 23 illustrates a flow chart of another exemplary array substrate fabrication process according to an embodiment of the disclosure. The corresponding structure of the array substrate is shown in FIGS. 13-15 and 25. As shown in FIG. 23, at the beginning, a base substrate is provided (S2302). The substrate may be a transparent substrate, such as a glass plate. A plurality of gate lines and a plurality of data lines are formed on the base substrate, wherein the gate lines and the data lines may be insulated from each other and cross each other to define a plurality of pixel units (S2304). Referring to FIG. 1, the plurality of pixel units 13 may be arranged in an array. The pixel units 13 may include pixel electrodes and common electrodes. The common electrodes and the pixel electrodes may be obtained through patterning a same pixel electrode layer and a same common electrode layer, respectively.

Returning to FIG. 23, after the gate lines and data lines are formed on the base substrate, a fifth insulating layer is formed on the data lines (S2306). In particular, the fifth insulating layer may be formed by oxidation or deposition process. Depending on the specific structure of the pixel units, the fifth insulating layer may be a single-layered insulating layer or a multilayered insulating layer.

After the fifth insulating layer is formed over the data lines, a plurality of pixel electrodes are formed on the fifth insulating layer (S2308) and a sixth insulating layer is on the pixel electrodes (S2310). Then at least one shielding electrode extending along the extension direction of the data line and at least one shielding branch electrode extending along the extension direction of the gate line are formed on the sixth insulating layer, and the shielding electrode is electrically connected to the shielding branch electrode (S2312).

In particular, referring to FIGS. 13-15, along the direction perpendicular to the array substrate, the projection of the shielding electrode M31 onto the data line D3 may be at least partially overlapped with the data line D3, and the projection of the shielding branch electrode M32 onto the gate line G2 may be at least partially overlapped with the gate line G2.

Returning to FIG. 23, after the shielding electrode and the shielding branch electrode are formed on the sixth insulating layer, a seventh insulating layer is formed on the shielding electrode and the shielding branch electrode (S2314). In particular, the seventh insulating layer may be a single-layered insulating layer, and may include one or more of a silicon oxide film, a silicon nitride film, a silicon nitride oxide film, an aluminum oxide film or a titanium oxide film. Further, the seventh insulating layer may be films formed by other inorganic insulating materials which have a same or similar property as the above-mentioned films.

Moreover, referring to FIGS. 13-15, due to the inorganic insulating material properties, the areas of the insulating layer 1304, where the shielding branch electrode M32 and the shielding electrode M31 are embedded, may be raised areas. In particular, when the array substrate is used to fabricate a display panel with the color film substrate, the photo spacers in the color film substrate may be attached onto the raised areas of the array substrate where the shielding branch electrodes are embedded.

Returning to FIG. 23, after the seventh insulating layer is formed on the shielding electrode and the shielding branch electrode, a common electrode layer is formed on the seventh insulating layer, at least one first slot extending in the extension direction of the data line is formed in the common electrode layer, and at least one second slot extending in the extension direction of the gate line is formed in the common electrode layer (S2316).

In particular, referring to FIGS. 13-15, along a direction perpendicular to the array substrate, a projection of the first slot K1 on the array substrate may be at least partially overlapped with a projection of the pixel electrode Px1 on the array substrate. The second slot K2 may be disposed above the gate line G2, and may be at least partially overlapped with the first slot K1.

In addition, at least one fourth via hole may be formed in the seventh insulating layer, and the common electrode layer may be electrically connected to the shielding branch electrode through the fourth via hole. The shielding branch electrode or the shielding electrode may be used as the signal line of the common electrode for realizing touch driving or display driving through a time-multiplexing driving method. To generate a controllable electric field between the pixel electrode and the common electrode to drive a display medium, the common electrode layer may be etched to form an electrode structure including a plurality of sub-electrodes.

Further, before forming the fifth insulating layer on the data lines, the fabrication process may further include the following steps. Gate electrodes electrically connected to the gate lines may be formed on the base substrate. A gate insulating layer may be formed on the gate electrodes. An active layer may be formed on the gate insulating layer. Source electrodes, drain electrodes, and a metal lay for the data lines may be formed on the active layer. Then the fifth insulating layer may be disposed on the data lines, and the pixel electrodes may be electrically connected to the drain electrodes through at least one third via hole formed in the fifth insulating layer.

In another embodiment, after the fifth insulating layer is formed over the data lines, the common electrode layer rather than the pixel electrodes may be firstly formed on the fifth insulating layer. To generate a controllable electric field between the pixel electrode and the common electrode to drive a display medium, for example, a liquid crystal layer, each pixel electrode may be etched to form an electrode structure including a plurality of sub-electrodes, and each common electrode may be fabricated into one or more sub-electrodes.

Figure 24:
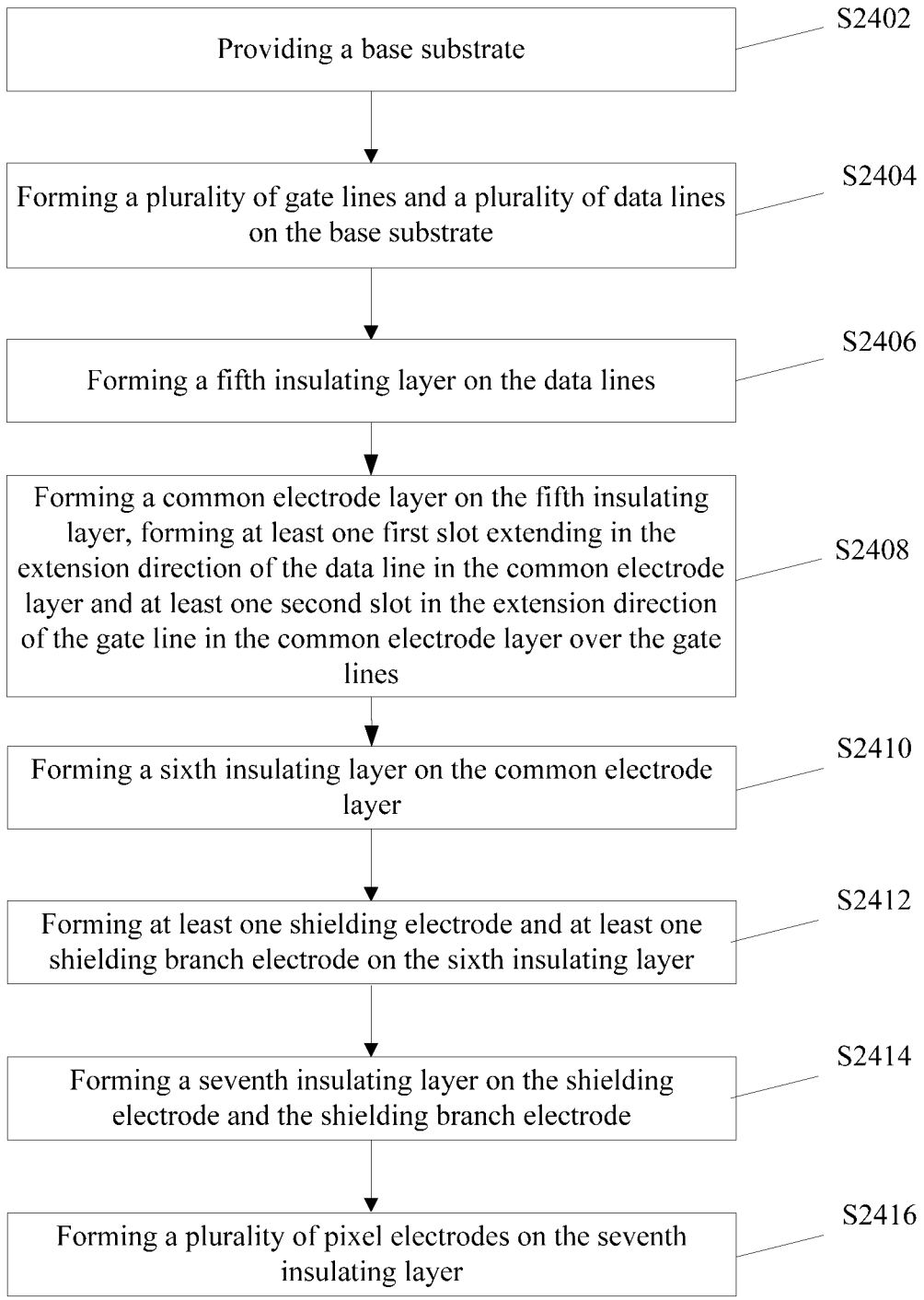
FIG. 24 is a flow chart of another exemplary array substrate fabrication process according to an embodiment of the disclosure.

FIG. 24 illustrates a flow chart of another exemplary array substrate fabrication process according to an embodiment of the disclosure. The similarities between FIG. 23 and FIG. 24 are not repeated here, while certain differences may be further illustrated. As shown in FIG. 24, at the beginning, the steps S2402-S2406 in FIG. 24 may be similar to the steps S2302-S2306 in FIG. 23 respectively.

The difference is: after the fifth insulating layer is formed over the data lines, a common electrode layer is formed on the fifth insulating layer, at least one first slot is formed in the common electrode layer in the extension direction of the data line, and at least one second slot is formed in the common electrode layer over the gate lines (S2408). A sixth insulating layer is on the common electrode layer (S2410).

Then at least one shielding electrode and at least one shielding branch electrode are formed on the sixth insulating layer, and the shielding electrode is electrically connected to the shielding branch electrode (S2412). A seventh insulating layer is formed on the shielding electrode and the shielding branch electrode (S2414), and a plurality of pixel electrodes are formed on the seventh insulating layer (S2416).

The fabricated array substrate may also exhibit some raised areas where the shielding branch electrodes are embedded. After the array substrate and color film substrate are aligned and attached to each other, the photo spacers may be attached onto the raised areas of the array substrate where the shielding branch electrodes are embedded.

Further, before forming the fifth insulating layer on the data lines (S2406), the fabrication process may further include the following steps. Gate electrodes electrically connected to the gate lines may be formed on the base substrate. A gate insulating layer may be formed on the gate electrodes. An active layer may be formed on the gate insulating layer. Source electrodes, drain electrodes, and a metal layer for the data lines may be formed on the active layer.

After forming the sixth insulating layer on the common electrode (S2410), at least one fifth via hole may be formed in the sixth insulating layer, such that the sixth insulating layer may be electrically connected to the shielding branch electrode or the shielding electrode through the fifth via hole.

After forming the pixel electrodes on the seventh insulating layer (S2416), at least one sixth via hole may be formed on each of the fifth, sixth and seventh insulating layers, and the pixel electrode may be electrically connected to the drain electrode through the sixth via hole.

In the disclosed embodiments, the common electrode layer in the array substrate may include at least one first slot and at least one second slot at least partially overlapped with the first slot. Through disposing the shielding electrode above the data line and the shielding branch electrode above the gate line, the electric field leakage of the data line and the gate lines may be suppressed. Accordingly, the light leakage of the display panel comprising the disclosed array substrate may be also reduced.

On the other hand, the projection of the first slot on the array substrate may be at least partially overlapped with at least one of the projection of the data line on the array substrate and the projection of the pixel electrode on the array substrate. In particular, when the projection of the first slot on the array substrate is at least partially overlapped with the projection of the pixel electrode on the array substrate, the first slot may be no longer facing the data line. The electric field leakage of the data line may be further suppressed, and the light leakage of the display panel comprising the disclosed array substrate may be further reduced accordingly. In addition, because the data lines may be no longer disposed under the slots in the common electrode layer, the slots may be fabricated to have a larger width, which may reduce the technology difficulty of the manufacture process, improve the manufacture efficiency and lower the fabrication cost.

Further, when the array substrate and the color film substrate are aligned and attached to each other, the photo spacers may be attached onto the raised areas of the array substrate where the shielding branch electrodes are embedded. Thus, the uniform cell gap across the display panel may be realized and the EO characteristics of display panel may be stabilized. That is, the precision level uniformity of cell gap of the display device may be effectively maintained, and high-quality images may be constantly realized.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An array substrate, comprising:
a base substrate;
a plurality of gate lines and a plurality of data lines disposed on the base substrate, wherein the plurality of gate lines and the plurality of data lines are insulated from each other and cross each other to define a plurality of pixel units;
a plurality of pixel electrodes;
a common electrode layer including at least one first slot and at least one second slot, wherein the at least one second slot is at least partially overlapped with the at least one first slot, and the common electrode layer has a plurality of common electrodes;
at least one shielding electrode disposed above a data line; and
at least one shielding branch electrode disposed above a gate line and electrically connected to the at least one shielding electrode,
wherein the at least one first slot and the at least one shielding electrode are extending in an extension direction of the plurality of data lines, the at least one second slot and the at least one shielding branch electrode are extending in an extension direction of the plurality of gate lines, a projection of the at least one shielding electrode onto the data line is at least partially overlapped with the data line, a projection of the at least one shielding branch electrode onto the gate line is at least partially overlapped with the gate line, and the array substrate exhibits at least one raised area where the at least one shielding branch electrode is embedded.

2. The array substrate according to claim 1, wherein:
along a direction perpendicular to the array substrate, a projection of the at least one first slot on the array substrate is at least partially overlapped with at least one of a projection of a pixel electrode on the array substrate and a projection of the data line on the array substrate.

3. The array substrate according to claim 1, wherein:
along a direction perpendicular to the array substrate, a pixel electrode is disposed between the at least one shielding branch electrode and the data line; and
the at least one shielding branch electrode is disposed between the common electrode layer and the pixel electrode.

4. The array substrate according to claim 3, wherein:
a seventh insulating layer having at least one fourth via hole is disposed between the at least one shielding branch electrode and the common electrode layer; and
a common electrode is electrically connected to the at least one shielding branch electrode or the at least one shielding electrode through the at least one fourth via hole.

5. The array substrate according to claim 4, wherein:
the seventh insulating layer exhibits at least one raised area where the at least one shielding branch electrode is embedded.

6. The array substrate according to claim 1, wherein:
along a direction perpendicular to the array substrate, the common electrode layer is disposed between the at least one shielding branch electrode and the data line; and
the at least one shielding branch electrode is disposed between the common electrode layer and a pixel electrode.

7. The array substrate according to claim 6, wherein:
a sixth insulating layer having at least one fifth via hole is disposed between the at least one shielding branch electrode and the common electrode layer; and
a common electrode is electrically connected to the at least one shielding branch electrode or the at least one shielding electrode through the at least one fifth via hole.

8. The array substrate according to claim 7, wherein:
a seventh insulating layer is disposed between the at least one shielding branch electrode and the pixel electrode; and
the seventh insulating layer exhibits at least one raised area where the at least one shielding branch electrode is embedded.

9. A display device, comprising:
an array substrate comprising:
a base substrate;
a plurality of gate lines and a plurality of data lines disposed on the base substrate, wherein the plurality of gate lines and the plurality of data lines are insulated from each other and cross each other to define a plurality of pixel units;
a plurality of pixel electrodes;
a common electrode layer including at least one first slot and at least one second slot, wherein the at least one second slot is at least partially overlapped with the at least one first slot, and the common electrode layer has a plurality of common electrodes;
at least one shielding electrode disposed above a data line; and
at least one shielding branch electrode disposed above a gate line and electrically connected to the at least one shielding electrode,
wherein the at least one first slot and the at least one shielding electrode are extending in an extension direction of the plurality of data lines, the at least one second slot and the at least one shielding branch electrode are extending in an extension direction of the plurality of gate lines, a projection of the at least one shielding electrode onto the data line is at least partially overlapped with the data line, a projection of the at least one shielding branch electrode onto the gate line is at least partially overlapped with the gate line, and the array substrate exhibits at least one raised area where the at least one shielding branch electrode is embedded;
an opposite substrate including a plurality of photo spacers; and
display medium sandwiched between the array substrate and the opposite substrate,
wherein at least one photo spacer is attached to the at least one raised area where the at least one shielding branch electrode is embedded.

10. The display device according to claim 9, wherein:
along a direction perpendicular to the array substrate, a projection of the at least one first slot on the array substrate is at least partially overlapped with at least one of a projection of a pixel electrode on the array substrate and a projection of the data line on the array substrate.

11. The display device according to claim 9, wherein:
along a direction perpendicular to the array substrate, a pixel electrode is disposed between the at least one shielding branch electrode and the data line; and
the at least one shielding branch electrode is disposed between the common electrode layer and the pixel electrode.

12. The display device according to claim 9, wherein:
along a direction perpendicular to the array substrate, the common electrode layer is disposed between the at least one shielding branch electrode and the data line; and
the at least one shielding branch electrode is disposed between the common electrode layer and a pixel electrode.

13. A method for fabricating an array substrate, comprising:
providing a base substrate,
forming a plurality of gate lines on the base substrate;
forming a plurality of data lines on the base substrate, wherein the plurality of gate lines and the plurality of data lines are insulated from each other and cross each other to define a plurality of pixel units,
forming a fifth insulating layer on the plurality of data lines;
forming a plurality of pixel electrodes above the plurality of data lines;
forming at least one shielding electrode above a data line and at least one shielding branch electrode above a gate line, wherein the at least one shielding electrode and the at least one shielding branch electrode are electrically connected;
forming a common electrode layer including at least one first slot and at least one second slot above the plurality of data lines, wherein the at least one first slot is at least partially overlapped with the at least one second slot and the common electrode layer includes a plurality of common electrodes,
wherein the at least one first slot and the at least one shielding electrode are extending in an extension direction of the plurality of data lines, the at least one second slot and the at least one shielding branch electrode are extending in an extension direction of the plurality of gate lines, a projection of the at least one shielding electrode onto the data line is at least partially overlapped with the data line, a projection of the at least one shielding branch electrode onto the gate line is at least partially overlapped with the gate line, and the array substrate exhibits at least one raised area where the at least one shielding branch electrode is embedded.

14. The method for fabricating an array substrate according to claim 13, wherein
along a direction perpendicular to the array substrate, a projection of the at least one first slot on the array substrate is at least partially overlapped with at least one of a projection of a pixel electrode on the array substrate and a projection of the data line on the array substrate.

15. The method for fabricating an array substrate according to claim 13, wherein, before forming the fifth insulating layer on the plurality of data lines, the method further includes:
forming, on the base substrate, a gate electrode electrically connected to the gate line;
forming a gate insulating layer on the gate electrode;
forming an active layer on the gate insulating layer; and
forming, on the active layer, a source electrode, a drain electrode, and a metal layer for the data line,
wherein the fifth insulating layer having at least one third via hole is formed on the source electrode, the drain electrode, and the metal layer, and
a pixel electrode is electrically connected to the drain electrode through the at least one third via hole.

16. The method for fabricating an array substrate according to claim 15, further including:
forming the plurality of pixel electrodes on the fifth insulating layer;
forming a sixth insulating layer on the plurality of pixel electrodes;
forming the at least one shielding electrode and the at least one shielding branch electrode on the sixth insulating layer;
forming a seventh insulating layer on the at least one shielding electrode and the at least one shielding branch electrode; and
forming the common electrode layer on the seventh insulating layer.

17. The method for fabricating an array substrate according to claim 16, further including:
forming at least one fourth via hole in the seventh insulating layer, wherein a common electrode is electrically connected to the at least one shielding branch electrode through the at least one fourth via hole.

18. The method for fabricating an array substrate according to claim 13, wherein, before forming the fifth insulating layer on the plurality of data lines, the method further includes:
forming, on the substrate, a gate electrode electrically connected to the gate line;
forming a gate insulating layer on the gate electrode;
forming an active layer on the gate insulating layer; and
forming, on the active layer, a source electrode, a drain electrode, and a metal layer for the data line,
wherein the fifth insulating layer is formed on the source electrode, the drain electrode, and the metal layer.

19. The method for fabricating an array substrate according to claim 18, further including:
forming the common electrode layer on the fifth insulating layer;
forming a sixth insulating layer on the common electrode layer;
forming the at least one shielding electrode and the at least one shielding branch electrode on the sixth insulating layer;
forming a seventh insulating layer on the at least one shielding electrode and the at least one shielding branch electrode; and
forming the plurality of pixel electrodes on the seventh insulating layer.

20. The method for fabricating an array substrate according to claim 19, wherein, after forming the plurality of pixel electrodes on the seventh insulating layer, the method further including:
forming at least one sixth via hole in each of the fifth, sixth, and seventh insulating layers, wherein a pixel electrode is electrically connected to the drain electrode through the at least one sixth via hole formed in each of the fifth, sixth, and seventh insulating layers.

* * * * *